(12) United States Patent
Fujikawa et al.

(10) Patent No.: US 8,344,379 B2
(45) Date of Patent: Jan. 1, 2013

(54) DISPLAY DEVICE AND MANUFACTURING METHOD OF THE SAME

(75) Inventors: Saishi Fujikawa, Kanagawa (JP); Kunio Hosoya, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 370 days.

(21) Appl. No.: 12/565,854

(22) Filed: Sep. 24, 2009

(65) Prior Publication Data

US 2010/0032708 A1    Feb. 11, 2010

Related U.S. Application Data

(62) Division of application No. 11/591,556, filed on Nov. 2, 2006, now Pat. No. 7,615,495.

(30) Foreign Application Priority Data

Nov. 17, 2005 (JP) ................................. 2005-333207

(51) Int. Cl.
*H01L 29/04* (2006.01)
*H01L 33/00* (2010.01)

(52) U.S. Cl. ............... 257/59; 257/72; 257/E21.414

(58) Field of Classification Search ........... 257/59, 257/72, 99, E33.066
See application file for complete search history.

(56) References Cited

U.S. PATENT DOCUMENTS

| | | |
|---|---|---|
| 4,388,351 A | 6/1983 | Sawyer |
| 5,266,516 A | 11/1993 | Ho |
| 5,510,298 A | 4/1996 | Redwine |
| 5,550,405 A | 8/1996 | Cheung et al. |
| 5,679,608 A | 10/1997 | Cheung et al. |
| 5,943,105 A | 8/1999 | Fujikawa et al. |
| 5,965,934 A | 10/1999 | Cheung et al. |
| 6,218,257 B1 | 4/2001 | Kita |
| 6,297,519 B1 | 10/2001 | Fujikawa et al. |
| 6,469,317 B1 | 10/2002 | Yamazaki et al. |
| 6,501,098 B2 | 12/2002 | Yamazaki |
| 6,512,271 B1 | 1/2003 | Yamazaki et al. |
| 6,518,594 B1 | 2/2003 | Nakajima et al. |
| 6,524,895 B2 | 2/2003 | Yamazaki et al. |

(Continued)

FOREIGN PATENT DOCUMENTS

CN    1479146    3/2004

(Continued)

OTHER PUBLICATIONS

"Etchant for Palladium", IBM Technical Disclosure Bulletin, Apr. 1, 1980, vol. 22; No. 11, p. 5190.

(Continued)

*Primary Examiner* — Davienne Monbleau
*Assistant Examiner* — Selim Ahmed
(74) *Attorney, Agent, or Firm* — Nixon Peabody LLP; Jeffrey L. Costellia

(57) ABSTRACT

A plurality of wires and electrodes are formed by forming a first conductive film, selectively forming a resist over the first conductive film, forming a second conductive film over the first conductive film and the resist, removing the second conductive film formed over the resist by removing the resist, forming a third conductive film so as to cover the second conductive film formed over the first conductive film, and selectively etching the first conductive film and the third conductive film. Thus, wires using a low resistance material can be formed in a large-sized panel, and thus, a problem of signal delay can be solved.

24 Claims, 16 Drawing Sheets

U.S. PATENT DOCUMENTS

| | | |
|---|---|---|
| 6,570,552 B2 | 5/2003 | Yamazaki |
| 6,617,644 B1 | 9/2003 | Yamazaki et al. |
| 6,747,288 B2 | 6/2004 | Yamazaki et al. |
| 6,876,406 B2 | 4/2005 | Hwang |
| 6,891,270 B2 | 5/2005 | Sugawara et al. |
| 7,202,155 B2 | 4/2007 | Fukuchi |
| 7,358,183 B2 | 4/2008 | Fukuchi |
| 2001/0025960 A1* | 10/2001 | Ohtani et al. ............ 257/72 |
| 2002/0085157 A1* | 7/2002 | Tanaka et al. ............ 349/147 |
| 2002/0139980 A1* | 10/2002 | Yamazaki ................. 257/72 |
| 2005/0263769 A1* | 12/2005 | Chul Ahn ................. 257/72 |
| 2006/0166411 A1 | 7/2006 | Morisue et al. |
| 2008/0044647 A1 | 2/2008 | Nishibayashi et al. |
| 2010/0032708 A1* | 2/2010 | Fujikawa et al. ......... 257/99 |

FOREIGN PATENT DOCUMENTS

| | | |
|---|---|---|
| CN | 1581447 | 2/2005 |
| EP | 0 260 906 A2 | 3/1988 |
| EP | 1 746 622 A1 | 1/2007 |
| JP | 63-073645 | 4/1988 |
| JP | 04-027125 | 1/1992 |
| JP | 05-066421 | 3/1993 |
| JP | 06-082820 | 3/1994 |
| JP | 08-146463 | 6/1996 |
| JP | 08-227850 A | 9/1996 |
| JP | 08-297291 | 11/1996 |
| JP | 10-510953 | 10/1998 |
| JP | 11-026475 | 1/1999 |
| JP | 11-045883 A | 2/1999 |
| JP | 11-345498 A | 8/2000 |
| JP | 2000-236097 A | 8/2000 |
| JP | 2003-282788 | 10/2003 |
| JP | 2004-103605 | 4/2004 |
| SU | 1046803 A | 10/1983 |
| WO | WO-96/19830 A1 | 6/1996 |
| WO | WO-2005/093775 | 10/2005 |

OTHER PUBLICATIONS

Office Action (Application No. 200610149552.4; CN09163) Dated Dec. 25, 2009.

Korean Office Action (Application No. 2006-0108063; KR09163) Dated Nov. 8, 2012.

* cited by examiner

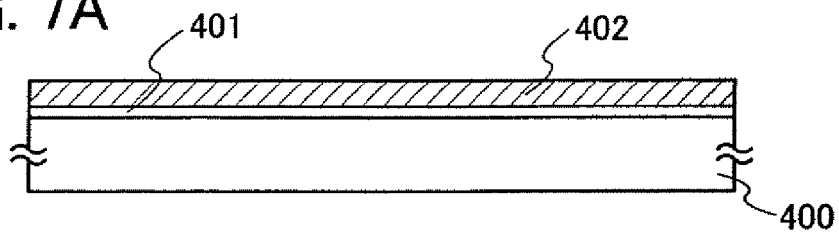
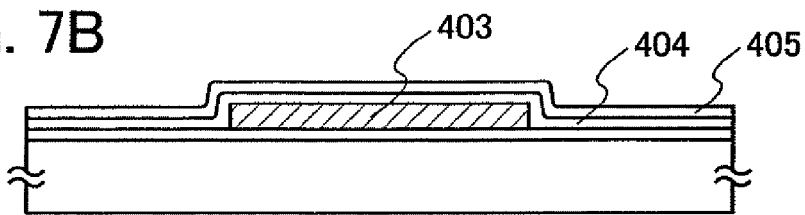
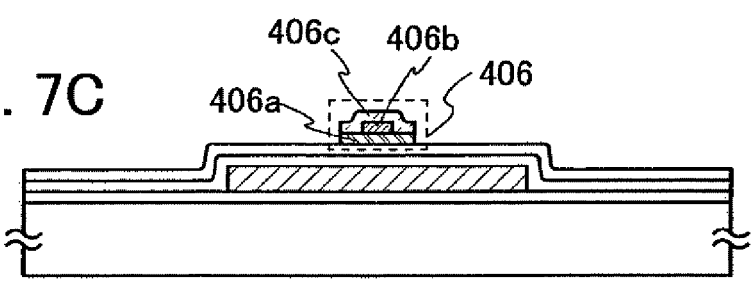
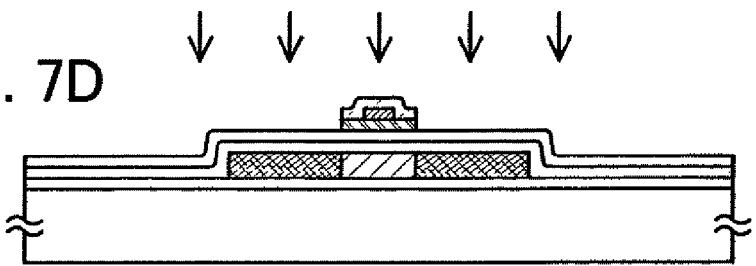
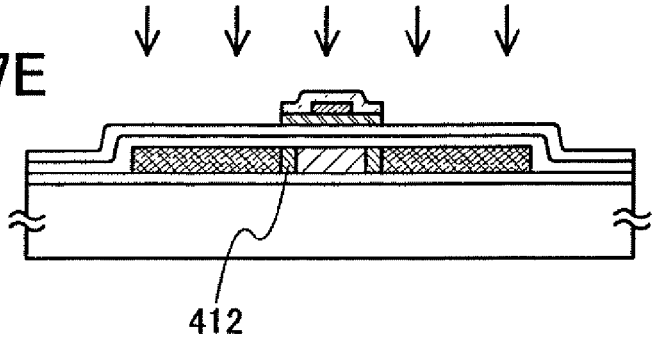

Pixel Region 1302  1301  Pixel Region

1303

Pixel Region

DISPLAY DEVICE AND MANUFACTURING METHOD OF THE SAME

BACKGROUND OF THE INVENTION

1. Field of the Invention

The present invention relates to a display device and a manufacturing method of the display device, specifically, a wire technology for the display device.

2. Description of the Related Art

In recent years, flat panel displays (FPDs) typified by liquid crystal display (LCD) devices or electroluminescence (EL) display devices have been attracting attention as display device substitutes for CRTs (Cathode Ray Tubes). In particular, development of a large-screen liquid crystal television set mounted with a large liquid crystal panel which is driven with an active matrix method is the primary task for liquid crystal panel manufacturers. Further, EL televisions having a large screen have been developed actively.

Conventionally, aluminum (Al) is mainly used as a wire material in a liquid crystal display device or an electroluminescence display device. Recently, with the increase in size of display panels, the problem of signal delay has been occurring, due to the increase in the length of wires (also referred to as a wiring) such as gate wires or source wires (also referred to as a gate wiring and a source wiring, respectively).

In order to solve this problem, it is effective to use a material which has lower electrical resistance than aluminum, which is currently used as a wire, for example copper (Cu). However, because copper is an element having mobility, when it is employed as a wire material, deterioration of a semiconductor element becomes a problem. In an integrated circuit, this problem is solved by, for example, a so-called "damascene" method, as shown in Reference 1 (Reference 1: Japanese Published Patent Application No. H 11-45883).

When a "damascene" method is adopted for manufacturing a panel, a polishing process (a planarization process) becomes a problem. In an integrated circuit using a Si wafer, the wafer size is about 300 mmφ, while the glass substrate size is more than 1 square meter, and thus, it is difficult to evenly polish the substrate. For this reason, it is not practical to use the "damascene" method for manufacturing a panel. Therefore, in order to use a copper wire for a panel, instead of the "damascene" method, a wire formation method is needed.

As panels become larger, the length of a leading wire through which a signal from outside the panel passes to be input into a pixel region also becomes a problem. For example, problems such as signal delays or dullness of waveforms occur because the lengths of leading wires (also referred to as a leading wiring) greatly differ among gate wires. For example, in the case of a structure such as that shown in FIG. 13A, because the lengths of a wire 1301 and a wire 1302 differ greatly from each other, the resistance value of each wire differs greatly, and thus, serious signal delay occurs.

In order to solve this problem, in a conventional method, a redundant wire is formed intentionally to make the wire lengths equal, and thus the influence of the delay is reduced. For example, as shown in FIG. 13B, by providing a redundant portion 1303 of the wire, the difference between the lengths of the wire 1301 and the wire 1302 in FIG. 13A is decreased so as to reduce the influence of the delay. However, a large area is needed in order to lead a wire in this method, and it is impossible to make the wire resistances exactly the same.

SUMMARY OF THE INVENTION

The present invention has been made in view of the above described problems. It is an object of the present invention to provide a display device with reduced wire resistance, and a display device in which signal delays, dullness of waveforms, and the like are decreased.

Structures of the present invention are described below. One structure of the present invention is a manufacturing method of a display device, comprising the steps of forming a first conductive film; selectively forming a resist over the first conductive film; forming a second conductive film over the first conductive film and the resist; removing the second conductive film formed over the resist by removing the resist; forming a third conductive film so as to cover the second conductive film formed over the first conductive film; and selectively etching the first conductive film and the third conductive film so as to form a plurality of wires and a plurality of electrodes.

Another structure of the present invention is a manufacturing method of a display device, comprising the steps of forming a first conductive film; selectively forming a resist over the first conductive film; forming a second conductive film over the first conductive film and the resist; removing the second conductive film formed over the resist by removing the resist; forming a third conductive film so as to cover the second conductive film formed over the first conductive film; selectively etching the first conductive film and the third conductive film so as to form a plurality of wires and a plurality of electrodes; forming a gate insulating film over the plurality of wires and the plurality of electrodes; forming a semiconductor film over the gate insulating film; selectively forming a channel protective film over the semiconductor film; forming a semiconductor film doped with an impurity element over the channel protective film and the semiconductor film; forming a fourth conductive film over the semiconductor film doped with the impurity element; selectively etching the semiconductor film, the semiconductor film doped with the impurity element, and the fourth conductive film; forming a protective film over the fourth conductive film; selectively etching the protective film; and forming a pixel electrode so as to be electrically connected to the fourth conductive film.

Another structure of the present invention is a manufacturing method of a display device, comprising the steps of forming a first conductive film; selectively forming a resist over the first conductive film; forming a second conductive film over the first conductive film and the resist; removing the second conductive film formed over the resist by removing the resist; forming a third conductive film so as to cover the second conductive film formed over the first conductive film; selectively etching the first conductive film and the third conductive film so as to form a plurality of wires and a plurality of electrodes; forming a gate insulating film to cover the plurality of wires and the plurality of electrodes; forming a semiconductor film over the gate insulating film; forming a semiconductor film doped with an impurity element over the semiconductor film; selectively etching the semiconductor film and the semiconductor film doped with the impurity element; forming a fourth conductive film over the semiconductor film and the semiconductor film doped with the impurity element; selectively etching the semiconductor film doped with the impurity element, and the fourth conductive film; forming a protective film to cover the fourth conductive film; selectively etching the protective film; and forming a pixel electrode so as to be electrically connected to the fourth conductive film.

Still another structure of the present invention is a manufacturing method of a display device, comprising the steps of forming an insulating film; forming a semiconductor film over the insulating film; selectively etching the semiconductor film; forming a gate insulating film to cover the semiconductor film which has been selectively etched; forming a first conductive film over the gate insulating film; selectively forming a first resist over the first conductive film; forming a second conductive film over the first conductive film and the first resist; removing the second conductive film formed over the first resist by removing the first resist; forming a third conductive film so as to cover the second conductive film formed over the first conductive film; and selectively etching the first conductive film and the third conductive film so as to form a plurality of wires and a plurality of electrodes.

Another structure of the present invention is a manufacturing method of a display device, comprising the steps of forming a first conductive film; selectively forming a first resist over the first conductive film; forming a second conductive film over the first conductive film and the first resist; removing the second conductive film formed over the first resist by removing the first resist; forming a third conductive film so as to cover the second conductive film formed over the first conductive film; selectively etching the first conductive film and the third conductive film so as to form a plurality of first wires and a plurality of first electrodes; forming a gate insulating film so as to cover the plurality of wires and the electrodes; forming a semiconductor film over the gate insulating film; forming a semiconductor film doped with an impurity element over the semiconductor film; forming a fourth conductive film so as to be electrically connected to the semiconductor film doped with the impurity element; selectively forming a second resist over the fourth conductive film; forming a fifth conductive film over the fourth conductive film and the second resist; removing the fifth conductive film formed over the second resist by removing the second resist; forming a sixth conductive film so as to cover the fifth conductive film formed over the fourth conductive film; and selectively etching the fourth conductive film and the sixth conductive film so as to form a plurality of second wires and a plurality of second electrodes.

Another structure of the present invention is a manufacturing method of a display device, comprising the steps of forming a first insulating film; forming a semiconductor film over the first insulating film; selectively etching the semiconductor film; forming a gate insulating film so as to cover the semiconductor film which has been selectively etched; forming a first conductive film over the gate insulating film; selectively forming a first resist over the first conductive film; forming a second conductive film over the first conductive film and the first resist; removing the second conductive film formed over the first resist by removing the first resist; forming a third conductive film so as to cover the second conductive film formed over the first conductive film; selectively etching the first conductive film and the third conductive film so as to form a plurality of first wires and a plurality of first electrodes; forming a second insulating film over the plurality of first wires and the plurality of first electrodes; selectively etching the gate insulating film and the second insulating film; forming a fourth conductive film so as to be electrically connected to the semiconductor film; selectively forming a second resist over the fourth conductive film; forming a fifth conductive film over the fourth conductive film and the second resist; removing the fifth conductive film formed over the second resist by removing the second resist; forming a sixth conductive film so as to cover the fifth conductive film formed over the fourth conductive film; and selectively etching the fourth conductive film and the sixth conductive film to form a plurality of second wires and a plurality of second electrodes.

In the above structures, a protective conductive film may be formed over the second conductive film or the fifth conductive film.

In the above structures, the resist, which includes the first resist or the second resist, may be formed such that an end portion thereof has an inverse tapered shape.

In the above structures, the resist, which includes the first resist or the second resist, may be formed so that an end portion thereof has a tapered shape which is almost perpendicular, or which has a taper angle of greater than or equal to 75° and less than 90°.

In the above structures, the resist, which includes the first resist or the second resist, may be formed by a droplet discharging method.

In the above structures, the second conductive film or the fifth conductive film may be formed such that resistances of the plurality of wires are almost equal to each other and resistances of the plurality of electrodes are almost equal to each other.

Another structure of the present invention is a display device comprising a semiconductor film; a gate insulating film; a gate electrode and a gate wire; and a source electrode and a source wire or a drain electrode and a drain wire (also referred to as a source or drain wiring and source or drain electrode). The gate electrode and the gate wire include a first conductive film; a second conductive film which is selectively formed over the first conductive film; and a third conductive film so as to cover the second conductive film.

Another structure of the present invention is a display device comprising a gate electrode and a gate wire; a gate insulating film formed so as to cover the gate electrode and the gate wire; a semiconductor film formed over the gate insulating film; a semiconductor film doped with an impurity element which is formed over the semiconductor film; and a source electrode and a source wire or a drain electrode and a drain wire which are electrically connected to the semiconductor film doped with the impurity element. The gate electrode and the gate wire include a first conductive film; a second conductive film which is selectively formed over the first conductive film; and a third conductive film so as to cover the second conductive film.

Still another structure of the present invention is a display device comprising a first insulating film; a semiconductor film formed over the first insulating film; a gate insulating film formed over the semiconductor film; a gate electrode and a gate wire formed over the gate insulating film; a second insulating film formed so as to cover the gate electrode and the gate wire; and a source electrode and a source wire or a drain electrode and a drain wire which are electrically connected to the semiconductor film. The gate electrode and the gate wire include a first conductive film; a second conductive film which is selectively formed over the first conductive film; and a third conductive film so as to cover the second conductive film.

In addition, in the above structures, the source electrode and the source wire, or the drain electrode and the drain wire may include a fourth conductive film, a fifth conductive film which is selectively formed over the fourth conductive film, and a sixth conductive film so as to cover the fifth conductive film.

In the above structures, the second conductive film or the fifth conductive film may include copper.

In the above structures, the first conductive film, the third conductive film, the fourth conductive film or the sixth conductive film may include at least one of tungsten, molybdenum, chromium and titanium.

In the above structures, the first conductive film and the third conductive film, or the fourth conductive film and the sixth conductive film may be formed from the same material.

In the above structures, a capacitor wire, which is formed in the same layer as the gate electrode and the gate wire, may be included.

In the above structures, a power supply line, which is formed in the same layer as the source electrode and the source wire or the drain electrode and the drain wire, may be included.

In the above structures, the second conductive film may be selectively formed by being divided into at least a first portion and a second portion of the gate electrode and the gate wire.

By using the present invention, a low resistance material can be used as a wire, and the problem of signal delay in a large panel can be solved.

In addition, a low resistance material portion of a leading wire is not partially formed according to wire length, and thus, the problem of wire length-dependent signal delay can be solved.

Further, since a low resistance material is used as a wire, a display device which has low electric power consumption and can operate at high speed can be manufactured.

BRIEF DESCRIPTION OF DRAWINGS

In the accompanying drawings:

FIGS. 7A to 7E show a manufacturing process of a semiconductor device to be used for a display device according to an aspect of the present invention;

DETAILED DESCRIPTION OF THE INVENTION

Figure 1A:
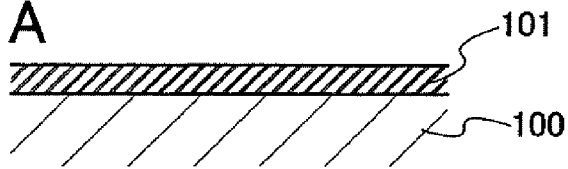
FIGS. 1A to 1F show a manufacturing process of a wire to be used for a display device according to an aspect of the present invention.

Embodiment Modes of the present invention will be described with reference to the drawings. The present invention can be carried out in many different modes without being limited to the description given below. It is easily understood by those skilled in the art that modes and details disclosed herein can be modified in various ways without departing from the spirit and the scope of the present invention. It should be noted that the present invention should not be interpreted as being limited to the description of the embodiment modes given below. Note that in the structures of the present invention described below, elements which are the same are indicated by the same reference numerals in the drawings.

Embodiment Mode 1

Embodiment Mode 1 will describe a manufacturing method of a wire using a low resistance material, with reference to FIGS. 1A to 1F.

First, a first conductive film 101 serving as a barrier layer is formed over a surface 100 (hereinafter, also referred to as a formation surface) to be provided with a wire (FIG. 1A). As a material of the first conductive film 101, any of tungsten (W), molybdenum (Mo), chromium (Cr), titanium (Ti) and tantalum (Ta), which are high melting point materials, or an alloy thereof (e.g., W—Mo, Mo—Cr, or Ta—Mo), or a nitride thereof (e.g., tungsten nitride (WNx), titanium nitride (TiNx), tantalum nitride (TaNx), or TiSiNx), or the like can be used. A sputtering method, a CVD method or the like can be adopted as the formation method.

Figure 1B:
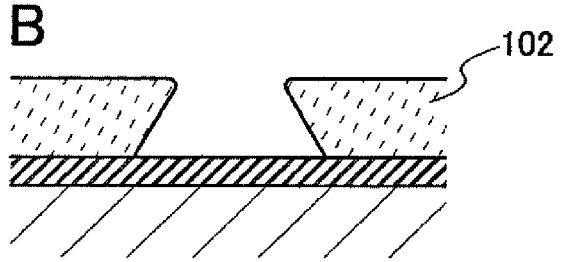

Then, a resist mask 102 is selectively formed over the first conductive film 101 (FIG. 1B). At this time, the resist mask 102 is selectively formed so as to expose a region in which a second conductive film 103 is to be formed later. The resist mask 102 is preferably formed to have an inverse tapered shape, as shown in FIG. 1B; however, there is no particular limitation on the shape of the resist mask 102, as long as the second conductive film to be formed later has a structure in which it is formed separately over the first conductive film 101 and the resist mask 102 in accordance with the shape of the resist mask. An end portion (an end face) of the resist mask 102 may be almost perpendicular to the formation surface, or may have a steep slant (i.e. taper shape), in which case a resist mask having a large thickness is preferably formed so that the aspect ratio is high. Specifically, a thickness of the resist mask is preferably 2 μm or more, more preferably 3 μm or more. In addition, there is no particular limitation on the taper angle of the end portion in the case that the resist mask 102 has a taper shape; however, for example, it may be formed to have an angle of greater than or equal to 75° and less than 90°, more preferably an angle of greater than or equal to 80° and less than 90°, and even more preferably an angle of greater than or equal to 85° and less than 90°. Here, "taper angle" refers to an angle of a resist with respect to a substrate. In addition, "inverse tapered shape" means a taper angle of greater than 90°, and "to be almost perpendicular" means 90° (±1°). In addition, the resist mask having an inverse tapered shape can be formed using a negative resist having a high absorbance with respect to exposure light.

A photolithography method using a photo-mask or a droplet discharging method may be adopted as a formation method of the resist mask. When a droplet discharging method is used, the resist mask can be directly formed without providing a photo-mask, and thus, the number of steps can be reduced. At this point, lyophilic and liquid-repellent regions may be formed. By forming the lyophilic and liquid-repellent regions, and dropping a resist material onto the lyophilic region, the shape of the resist mask can be easily controlled, and a resist mask with a desired shape can be easily formed. Note that the droplet discharging method is a method in which a composition including a formation material of an object which is fluid is discharged (jetted) as a droplet to form a pattern with a desired shape. In a formation region of the object, a droplet including a formation material of the object is discharged, baked, dried and so on to be solidified, thereby forming an object with a desired pattern.

Figure 1C:
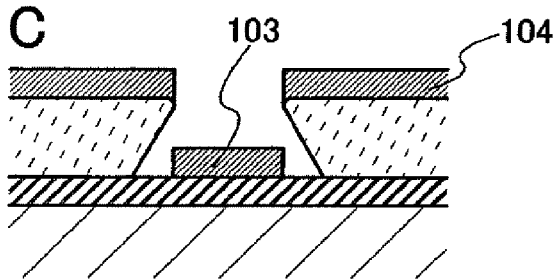

Next, second conductive films 103 and 104 are formed over the first conductive film 101 and the resist mask 102 (FIG. 1C). As the materials of the second conductive films 103 and 104, copper (Cu) is preferable; however, there is no particular limitation, as long as the materials are low resistance materials. For example, silver (Ag), aluminum (Al), gold (Au), or an alloy thereof, etc. can be used. As the formation method of the second conductive films 103 and 104, a sputtering method is preferable; however, a CVD method can be adopted as long as conditions that do not damage the resist mask 102 are selected. By this process, the second conductive films 103 and 104 are formed separately over the first conductive film 101 and the resist mask 102, respectively.

Figure 1D:
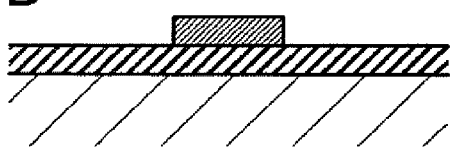

Then, the resist mask 102 is removed by using a resist stripper (FIG. 1D). At this point, the second conductive film 104 formed over the resist mask 102 is removed at the same time.

Figure 1E:
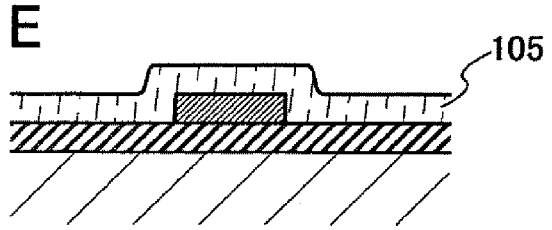

Next, a third conductive film 105 serving as a barrier film is formed so as to cover the second conductive film 103 (FIG. 1E). A material of the third conductive film 105 can be selected from similar materials that can be used for the first conductive film 101. In addition, a formation method of the third conductive film 105 can be the same method that can be used for the first conductive film 101.

Figure 1F:
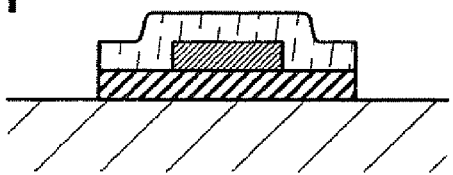

Then, the first conductive film 101 and the third conductive film 105 are selectively etched in accordance with the shape of the second conductive film 103, so that the second conductive film 103 is not exposed (FIG. 1F).

In accordance with the above described steps, a wire can be formed which has a structure in which the second conductive film 103 formed from a low resistance material is covered with the first conductive film 101 and the third conductive film 105 which serve as a barrier film. With this structure, even in the case of using an element having mobility (e.g., copper (Cu)) for the second conductive film, deterioration of a semiconductor film due to penetration of the element having mobility into the semiconductor film can be prevented.

As just described in this embodiment mode, in order to remove the second conductive film formed over the resist mask together with the resist mask, it is possible to form the second conductive film in only a desired region, and a polishing process (a planarization process) by using a CMP method or the like for removing unnecessary portion of the second conductive film, which is conducted in the so-called "damascene" method, is not necessary. Thus, low resistance material for a wire used for a panel substrate can be used without using the damascene method, and further, the problem of signal delay can be solved. Furthermore, in accordance with the present invention, a wire formed from a low resistance material can be formed even when a panel is made larger, and the problem of signal delay due to a leading wire can be solved.

Embodiment Mode 2

Embodiment Mode 2 will describe another mode of a manufacturing method of a wire using a low resistance material, with reference to FIGS. 2A to 2E.

Figure 2A:
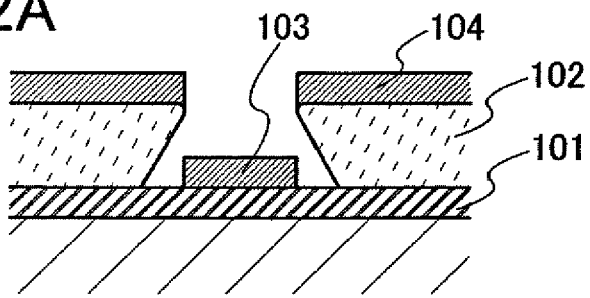
FIGS. 2A to 2E show a manufacturing process of a wire to be used for a display device according to an aspect of the present invention.

As in Embodiment Mode 1, second conductive films 103 and 104 are formed over first conductive film 101 and a resist mask 102 (FIG. 2A). As a material of the first conductive film 101, any of tungsten (W), molybdenum (Mo), chromium (Cr), titanium (Ti), and tantalum (Ta), which are high melting point materials, or an alloy thereof (e.g., W—Mo, Mo—Cr, or Ta—Mo) or a nitride thereof (e.g., tungsten nitride ($WN_x$), titanium nitride ($TiN_x$), tantalum nitride ($TaN_x$), or $TiSiN_x$), or the like can be used. A sputtering method, a CVD method, or the like can be adopted as the formation method.

As the materials of the second conductive films 103 and 104, copper (Cu) is preferable; however, there is no particular limitation as long as they are low resistance materials. For example, silver (Ag), aluminum (Al), gold (Au), an alloy thereof, or the like can be used. As the formation method of the second conductive films 103 and 104, a sputtering method is preferable; however a CVD method can be adopted, as long as conditions that do not damage the resist mask 102 are selected. By this process, the second conductive films 103 and 104 are separately formed over the first conductive film 101 and the resist mask 102, respectively.

Figure 2B:
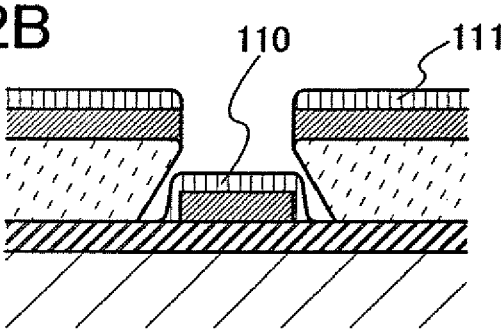

Next, protective conductive films 110 and 111 are formed over the second conductive films 103 and 104 (FIG. 2B). As materials of the protective conductive films 110 and 111, similarly to the first conductive film, any of tungsten (W), molybdenum (Mo), chromium (Cr), titanium (Ti), and tantalum (Ta), which are high melting point materials, or an alloy thereof (e.g., W—Mo, Mo—Cr, or Ta—Mo) or a nitride thereof (e.g., tungsten nitride ($WN_x$), titanium nitride ($TiN_x$), tantalum nitride ($TaN_x$), or $TiSiN_x$), or the like can be used. Similarly, a sputtering method, a CVD method, or the like can be adopted as the formation method.

By forming the protective conductive film 110, when the resist mask 102 is removed by a resist stripper, deterioration of the second conductive film 103 due to contact with the peeling solution can be prevented. Note that the second conductive film 103 and the protective conductive film 110 are formed in succession, without breaking vacuum. Thereby, deterioration of the second conductive film 103 due to a chemical reaction such as oxidation can be prevented. Thus, a multi-chamber apparatus is preferably used for film formation.

Note that the protective conductive film 110 is formed to be extremely thin on a side face of the conductive film 103, however compared with a case where the protective conductive film 110 is not formed, deterioration of the conductive film 103 due to the resist stripper can be greatly reduced. There is a possibility that surfaces other than the top face of the conductive film 103 may not be covered with the protective conductive film when an end portion of the conductive film 103 is inversely tapered, almost perpendicular, or steep; however, the area of the top face is by far larger than that of the side face and thus, deterioration of the conductive film 103 can be prevented effectively even when surfaces other than the top face of the conductive film 103 are not covered with the protective conductive film.

Figure 2C:
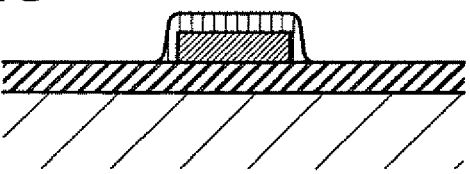

Next, the resist mask 102 is removed by a resist stripper (FIG. 2C). At this point, the second conductive film 104 and the protective conductive film 111 formed over the resist mask 102 are removed at the same time.

Figure 2D:
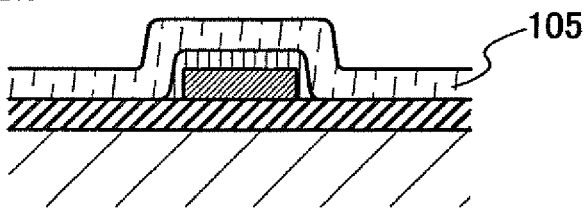

Then, a third conductive film 105 which serves as a barrier film is formed so as to cover the second conductive film 103 and the protective conductive film 110 (FIG. 2D). A material of the third conductive film 105 can selected from the same materials as those that can be used for the first conductive film 101. In addition, a formation method of the third conductive film 105 can be selected from the same methods that can be used for the first conductive film 101.

Figure 2E:
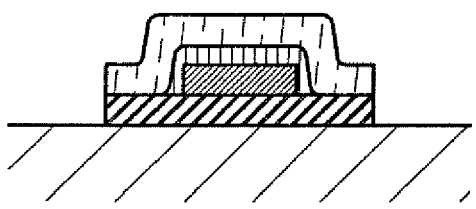

Then, the first conductive film 101 and the third conductive film 105 are selectively etched in accordance with the shape of the second conductive film 103 and the protective conductive film 110, so that the second conductive film 103 is not exposed (FIG. 2E).

By using this embodiment mode, a wire can be formed which has a structure in which the second conductive film 103 formed from a low resistance material is covered with the protective conductive film 110 and the first conductive film 101 and the third conductive film 105 which serve as a barrier film. With this structure, even in the case of using an element having mobility (e.g., copper (Cu)) for the second conductive film, deterioration of a semiconductor film due to penetration of the element having mobility into the semiconductor film can be prevented. In addition, by forming the protective conductive film, deterioration of the second conductive film caused by the resist stripper can be reduced.

Embodiment Mode 3

Embodiment Mode 3 will describe a manufacturing method of a bottom-gate type thin film transistor (hereinafter referred to as a TFT) using a low resistance material as a wire, with reference to FIGS. 3A to 3F and 4A to 4E.

Figure 3A:
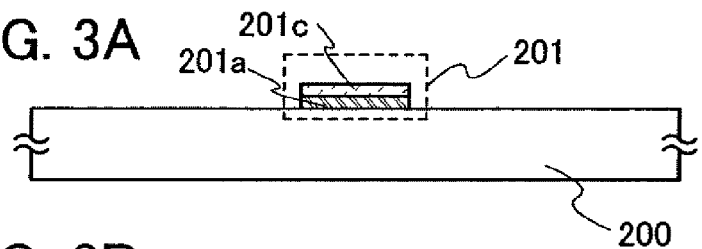
FIGS. 3A to 3F show a manufacturing process of a semiconductor device to be used for a display device according to an aspect of the present invention.

A wire 201 serving as a gate electrode is formed over a substrate 200 by the method shown in Embodiment Mode 1 (FIG. 3A). A thickness of the wire 201 is preferably 10 nm to 200 nm. The wire 201 includes a stacked structure of a first conductive film 201a, a second conductive film 201b, and a third conductive film 201c. In this embodiment mode, the second conductive film 201b formed from a low resistance material is not formed in a region which is to become a gate electrode later. In other words, the second conductive film 201b corresponding to the second conductive film 103 shown in FIG. 1F is not shown in FIGS. 3A to 3F and 4A to 4E, which show a cross-section of the thin film transistor. On the other hand, as shown in FIG. 4E, which is a top view, the second conductive film 201b is formed in a region other than the region 213 serving as the gate electrode. By adopting a structure in which the second conductive film 201b is not formed directly under the semiconductor film in this way, deterioration of the semiconductor film due to an element having mobility can be further reduced. In this embodiment mode, the method shown in Embodiment Mode 1 is adopted as the formation method of the wire 201; however, the method shown in Embodiment Mode 2 may be adopted. This embodiment mode shows a manufacturing method of a single gate type TFT; however, a multigate structure in which two or more gate electrodes are provided may be adopted. By employing a multigate structure, a TFT with less off-leakage current can be formed.

As the substrate 200, a glass substrate formed from barium borosilicate glass, alumino borosilicate glass, or the like, a silicon substrate, a plastic substrate or a resin substrate having heat resistance, or the like can be used. As a plastic substrate or a resin substrate, polyethylene terephthalate (PET), polyethylene naphthalate (PEN), polyethersulfone (PES), acrylic, polyimide, or the like can be used.

A wire 201 may be formed over the substrate 200 after forming a base film. The base film is formed from a single layer or a stacked layer of an oxide material or a nitride material including silicon, by a method such as a CVD method, a plasma CVD method, a sputtering method, or a spin coating method. The base film is not necessarily formed, however it has a function of blocking contaminants or the like from the substrate 200.

Figure 3B:
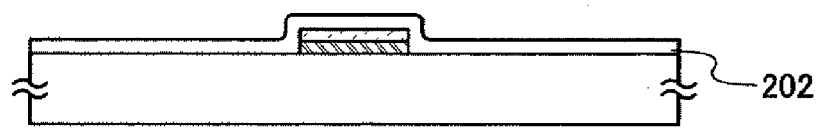

Then, a gate insulating film 202 is formed over the wire 201 which serves as a gate electrode (FIG. 3B). In this embodiment mode, the gate insulating film has a single layer structure; however, it may have a stacked structure including two or more layers.

As a material of the gate insulating film 202, silicon oxide ($SiO_x$: x>0), silicon nitride ($SiN_x$: x>0), silicon oxynitride ($SiO_xN_y$: x>y>0), silicon nitride oxide ($SiN_xO_y$: x>y>0), or the like can be used as appropriate. In order to prevent impurities or the like from the substrate side from diffusing, silicon nitride ($SiN_x$: x>0), silicon nitride oxide ($SiN_xO_y$: x>y>0) or the like is preferably used as the gate insulating film 202. In addition, in order to form a dense insulating film with low gate leakage current at a low film formation temperature, it is preferable that a rare gas element such as argon is included in a reactive gas and mixed into the insulating film when it is formed. In this embodiment mode, a silicon nitride film is formed as the gate insulating film 202 by using $SiH_4$ and $NH_3$ as a reactive gas to have a thickness of 10 nm to 100 nm (preferably, 20 nm to 80 nm), for example, 50 nm. Note that the thickness of the gate insulating film 202 is not limited to this range.

Figure 3C:
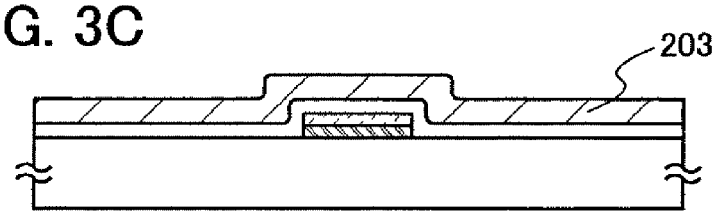

Next, a semiconductor film 203 is formed over the gate insulating film 202 (FIG. 3C). The semiconductor film 203 may be formed with a thickness of 25 nm to 200 nm preferably, 50 nm to 150 nm) by a sputtering method, an LPCVD method, a plasma CVD method, or the like. In this embodiment mode, an amorphous semiconductor film is used; however, the embodiment mode is not limited to this, and a crystalline semiconductor film may be used.

Figure 3D:
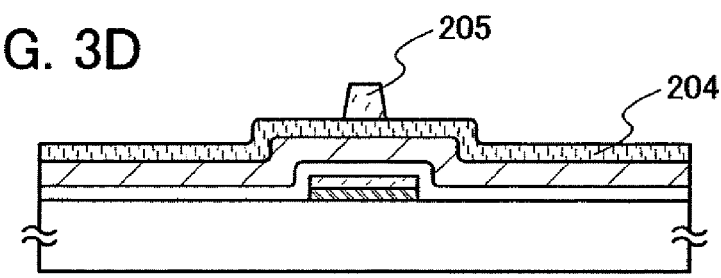
Figure 3E:
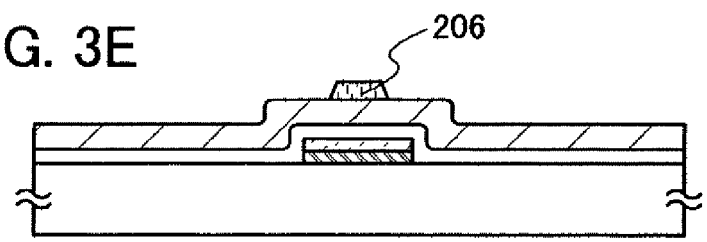

Then, a channel protective film 204 is formed over the semiconductor film 203, and a resist 205 is formed over the channel protective film 204 by a photolithography process (FIG. 3D). The channel protective film 204 is processed into a desired shape by using the resist 205 as a mask, to form a channel protective layer 206 (FIG. 3E). FIG. 3E shows a state in which the resist 205 has been removed. As a material of the channel protective film 204, silicon oxide ($SiO_x$: x>0), silicon nitride ($SiN_x$: x>0), silicon oxynitride ($SiO_xN_y$: x>y>0), silicon nitride oxide ($SiN_xO_y$: x>y>0), or the like can be used as appropriate. The semiconductor film in a channel portion can be prevented from being etched at the time of forming a source electrode layer and a drain electrode layer by forming the channel protective layer 206, although the channel protective layer 206 is not necessarily formed. In this embodiment mode, the channel protective layer 206 is formed by forming silicon nitride as the channel protective film 204 and processing it.

Figure 3F:
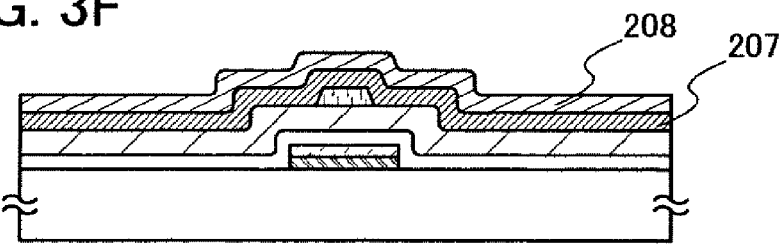

After removing the resist 205, a semiconductor film 207 doped with an impurity element is formed over the semiconductor film 203 and the channel protective layer 206. Here, for example, phosphorus (P) is added as an impurity element at a concentration of about $5 \times 10^{19}$ to $5 \times 10^{20}/cm^3$ so as to form an n-type semiconductor film. Alternatively, by adding an impurity element having a p-type conductivity, a p-type semiconductor film may be formed. As the impurity element having an n-type conductivity, phosphorus (P), arsenic (As), or the like can be used. As the impurity element having a p-type conductivity, boron (B), aluminum (Al), gallium (Ga), or the like can be used. After that, a fourth conductive film 208 is formed over the semiconductor film 207 doped with the impurity element (FIG. 3F).

Figure 4A:
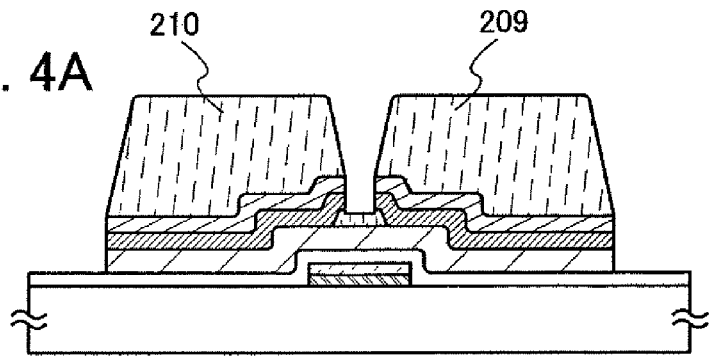
FIGS. 4A to 4E show a manufacturing process of a semiconductor device to be used for a display device according to an aspect of the present invention.

Then, masks 209 and 210 made of resist are formed by a photolithography process, and the semiconductor film 203, the semiconductor film 207 doped with an impurity element, and the fourth conductive film 208 are etched into a desired shape (FIG. 4A).

Figure 4B:
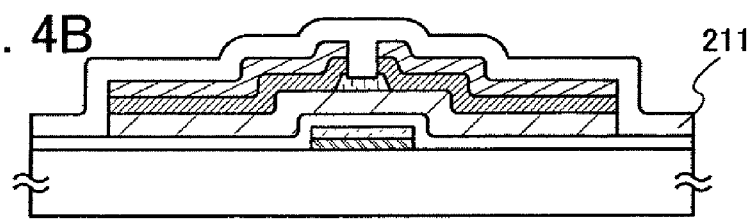
Figure 4C:
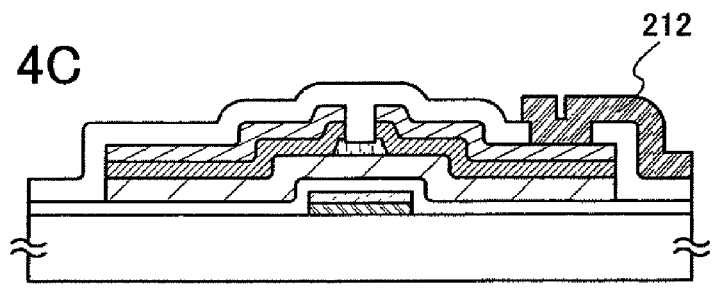

The masks 209 and 210 are removed and a protective film 211 is formed (FIG. 4B). Further, a contact hole is formed in the protective film 211 and a desired electrode 212 is formed so as to be electrically connected to the fourth conductive film 208 (FIG. 4C).

As a material of the electrode 212, indium tin oxide (ITO) in which tin oxide is mixed into indium oxide, indium tin silicon oxide (ITSO) in which silicon oxide is mixed into indium tin oxide (ITO), indium zinc oxide (IZO) in which zinc oxide is mixed into indium oxide, zinc oxide (ZnO), tin oxide ($SnO_2$), a metal such as aluminum (Al), or the like can be used as appropriate, according to the use of the electrode 212. Indium zinc oxide (IZO) is a transparent conductive material formed by a sputtering method using a target in which zinc oxide (ZnO) at 2 to 20 wt % is mixed into indium oxide.

In this embodiment mode, in the etching process, plasma etching (dry etching) or wet etching may be employed; however, plasma etching is suitable for processing a large-sized substrate. As an etching gas, a fluorine-based gas such as $CF_4$, $NF_3$, $SF_6$ or $CHF_3$, a chlorine-based gas typified by gases such as $Cl_2$, $BCl_3$, $SiCl_4$ or $CCl_4$, or $O_2$ gas is used, and an inert gas such as He or Ar may be added as appropriate.

A commercial resist material containing a photosensitizing agent may be used for the mask. For example, a positive type resist or a negative type resist may be used. In using any of the materials, the surface tension and the viscosity can be controlled as appropriate by adjusting the concentration of a solvent, adding a surfactant, or the like.

Through the above described steps, a bottom gate type TFT in which the semiconductor film in the channel portion is not etched can be formed. In accordance with this embodiment mode, in the case of forming a TFT using a wire of the present invention, since a low resistance material such as copper (Cu), for example, can be used for a wire, highly advantageous effects such as elimination of signal delay, higher speed operation, and reduction of power consumption can be obtained. The number of masks used increases by one, compared with a case where the wire of the present invention is not used; however, the present invention is extremely effective in manufacturing a display device, because of the highly advantageous effects of the present invention.

Figure 4D:
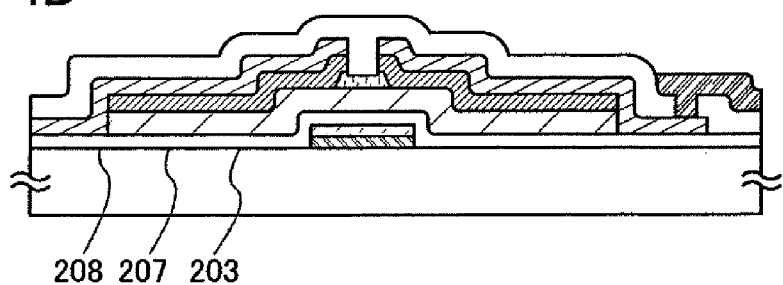
Figure 4E:
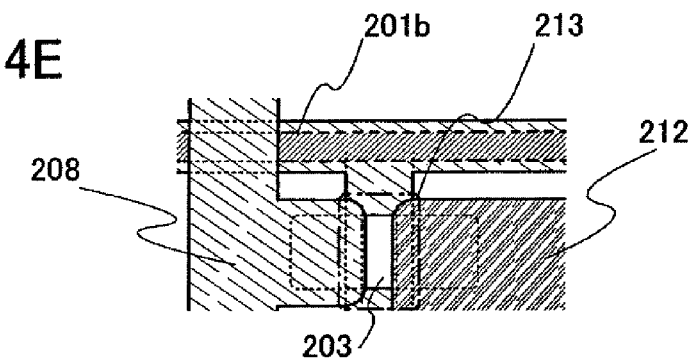

FIG. 4D shows a cross-sectional view of when a bottom gate type TFT is formed without forming a channel protective film. In the bottom gate type TFT shown in FIG. 4D, the fourth conductive film 208 is formed after etching the semiconductor film 203 and the semiconductor film 207 doped with an impurity element. In this case too, highly advantageous effects such as elimination of signal delay, higher speed operation, and reduction of power consumption can be obtained, since a low resistance material can be used as a wire.

This embodiment mode can be freely combined with Embodiment Mode 1 and/or Embodiment Mode 2.

Embodiment Mode 4

Embodiment Mode 4 will describe a manufacturing method of a bottom-gate type thin film transistor (hereinafter referred to as a TFT) using a low resistance material as a wire or an electrode, with reference to FIGS. 5A to 5F and 6A to 6E.

Figure 5A:
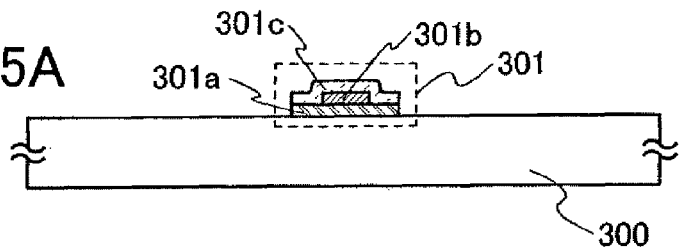
FIGS. 5A to 5F show a manufacturing process of a semiconductor device to be used for a display device according to an aspect of the present invention.

A wire 301 serving as a gate electrode is formed over a substrate 300 by the method shown in Embodiment Mode 1 (FIG. 5A). The wire 301 includes a stacked structure of a first conductive film 301a, a second conductive film 301b and a third conductive film 301c. A thickness of the wire 301 is preferably 10 nm to 200 nm. In this embodiment mode, the second conductive film 301b formed from a low resistance material is also formed in a region which is to become a gate electrode later; however, the present invention is not limited thereto. In this embodiment mode, the method shown in Embodiment Mode 1 is adopted as the formation method of the wire 301; however, the method shown in Embodiment Mode 2 may be adopted. This embodiment mode shows a manufacturing method of a single gate type TFT; however, a multigate structure in which two or more gate electrodes are provided may be adopted. By employing a multigate structure, a TFT with low off-leakage current can be formed.

As the substrate 300, a glass substrate formed from barium borosilicate glass or alumino borosilicate glass or the like, a silicon substrate, a plastic substrate or a resin substrate having heat resistance, or the like can be used. As a plastic substrate or a resin substrate, polyethylene terephthalate (PET), polyethylene naphthalate (PEN), polyethersulfone (PES), acrylic, polyimide, or the like can be used.

The wire 301 may be formed over the substrate 300 after forming a base film. The base film is formed from a single layer or a stacked layer of an oxide material or a nitride material including silicon by a method such as a CVD method, a plasma CVD method, a sputtering method, or a spin coating method. The base film is not necessarily formed, however it has a function of blocking contaminants or the like from the substrate 300.

Figure 5B:
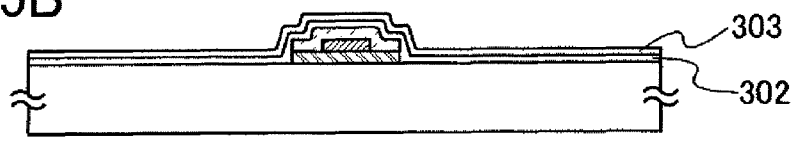

Then, a gate insulating film 302 and a gate insulating film 303 are formed to have a two-layer stacked structure over the wire 301 serving as a gate electrode (FIG. 5B). The gate insulating film is formed of an oxide material or a nitride material including silicon by a method such as a CVD method, a plasma CVD method, a sputtering method, or a spin coating method. The stacked insulating films may be formed in succession in the same chamber at the same temperature by changing reaction gases without breaking vacuum. By forming the insulting films in succession without breaking vacuum, contamination of interfaces between the stacked films can be prevented. In this embodiment mode, the gate insulating film has a two-layer stacked structure; however, it may have a single layer structure or a stacked structure including three or more layers.

As a material of the gate insulating films 302 and 303, silicon oxide ($SiO_x$: $x>0$), silicon nitride ($SiN_x$: $x>0$), silicon oxynitride ($SiO_xN_y$: $x>y>0$), silicon nitride oxide ($SiN_xO_y$: $x>y>0$), or the like can be used as appropriate. In order to prevent impurities from the substrate side from diffusing, silicon nitride ($SiN_x$: $x>0$), silicon nitride oxide ($SiN_xO_y$: $x>y>0$) or the like is preferably used as the gate insulating film 302. Further, silicon oxide ($SiO_x$: $x>0$) or silicon oxynitride ($SiO_xN_y$: $x>y>0$) is preferably used as the gate insulating film 303. Note that in order to form a dense insulating film with low gate leakage current at a low film formation temperature by using a CVD method, it is preferable that a rare gas element such as argon is included in a reactive gas and mixed into an insulating film when it is formed. In this embodiment mode, a silicon nitride film is formed as the gate insulating film 302 to have a thickness of 10 nm to 100 nm (preferably, 20 nm to 80 nm), for example, 50 nm, by a CVD method using $SiH_4$ and $NH_3$ as a reactive gas. In this embodiment mode, a silicon oxide film is formed as the gate insulating film 303 to have a thickness of 10 nm to 100 nm (preferably, 20 nm to 80 nm), for example, a thickness of 60 nm, by a CVD method using $SiH_4$ and $N_2O$ as a reactive gas. Note that each of the gate insulating films 302 and 303 preferably has a thickness in the range of 10 nm to 100 nm; however the thickness is not limited to this range.

Figure 5C:
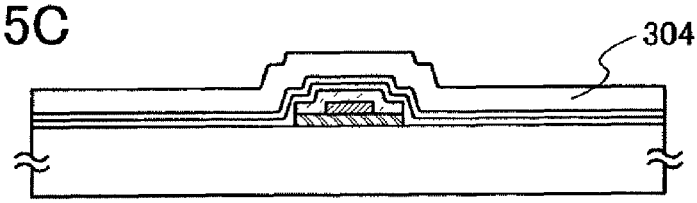

Next, a semiconductor film 304 is formed over the gate insulating film 303 (FIG. 5C). The semiconductor film 304 may be formed with a thickness of 25 nm to 200 nm (preferably, 50 nm to 150 nm) by a sputtering method, an LPCVD method, a plasma CVD method, or the like. In this embodiment mode, an amorphous semiconductor film is used; however, the embodiment mode is not limited to this, and a crystalline semiconductor film may be used.

Figure 5D:
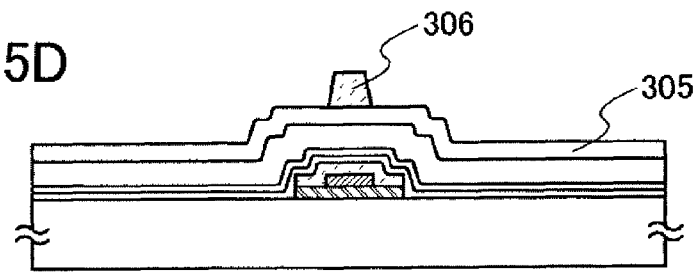
Figure 5E:
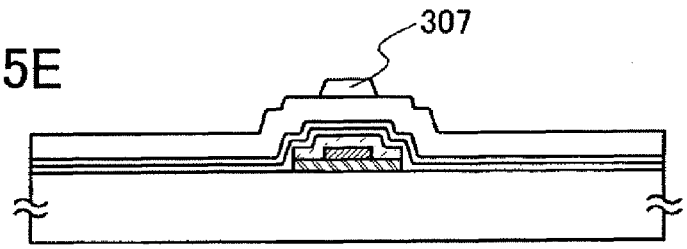
Figure 5F:
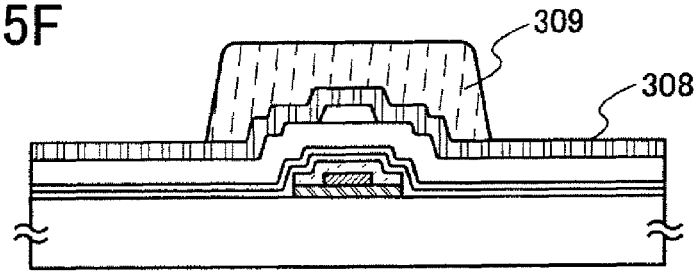

Then, a channel protective film 305 is formed over the semiconductor film 304 and a resist 306 is formed over the channel protective film 305 by a photolithography process (FIG. 5D). The channel protective film 305 is processed into a desired shape using the resist 306 as a mask to form a channel protective layer 307 (FIG. 5E). FIG. 5E shows a state in which the resist 306 has been removed. As a material of the channel protective film 305, silicon oxide ($SiO_x$: x>0), silicon nitride ($SiN_x$: x>0), silicon oxynitride ($SiO_xN_y$: x>y>0), silicon nitride oxide ($SiN_xO_y$: x>y>0), or the like can be used as appropriate. The semiconductor film in a channel portion can be prevented from being etched at the time of forming a source electrode layer and a drain electrode layer by forming the channel protective layer 307, although the channel protective layer 307 is not necessarily formed. In this embodiment mode, the channel protective layer 307 is formed by forming silicon nitride as the channel protective film 305 and processing it.

After removing the resist 306, a semiconductor film 308 doped with an impurity element is formed over the semiconductor film 304. Here, for example, phosphorus (P) is added as an impurity element at a concentration of about $5 \times 10^{19}$ to $5 \times 10^{20}/cm^3$ so that an n-type semiconductor film can be formed. Alternatively, by adding an impurity element having a p-type conductivity, a p-type semiconductor film may be formed. As the impurity element having an n-type conductivity, phosphorus (P), arsenic (As), or the like can be used. As the impurity element having a p-type conductivity, boron (B), aluminum (Al), gallium (Ga), or the like can be used.

Figure 6A:
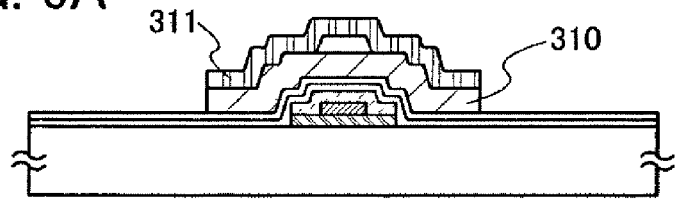
FIGS. 6A to 6E show a manufacturing process of a semiconductor device to be used for a display device according to an aspect of the present invention.
Figure 6B:
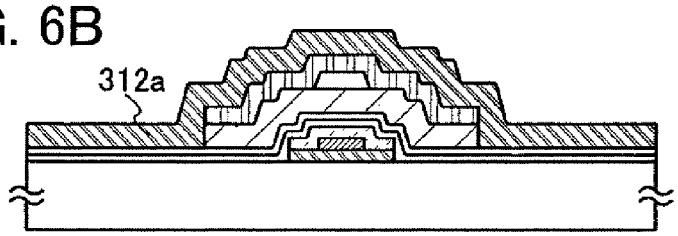

Then, a mask 309 made of resist is formed by a photolithography process (FIG. 5F) and etching is carried out using the mask 309 to form semiconductor films 310 and 311 (FIG. 6A). FIG. 6A shows a state in which the mask 309 has been removed. After that, a fourth conductive film 312a serving as a barrier film is formed so as to be electrically connected to the semiconductor film 311 (FIG. 6B).

Figure 6C:
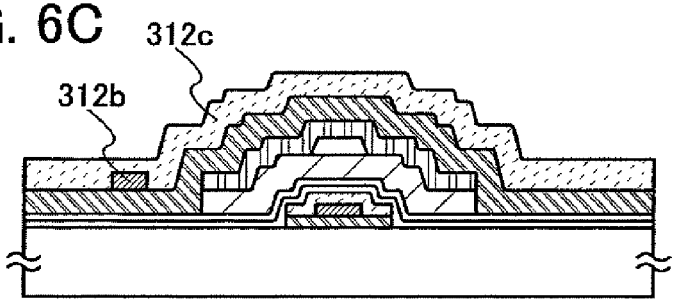

Then, a fifth conductive film 312b made of a low resistance material is formed over a region which is to become a wire later, which is over the fourth conductive film 312a, and a sixth conductive film 312c serving as a barrier film is formed so as to cover the fifth conductive film 312b (FIG. 6C). At this time, the fifth conductive film 312b can be formed by the method shown in Embodiment Mode 1. Note that the fifth conductive film 312b corresponds to the second conductive film 103 in Embodiment Mode 1. This embodiment mode employs the method shown in Embodiment Mode 1; however, the method shown in Embodiment Mode 2 may be employed.

Figure 6D:
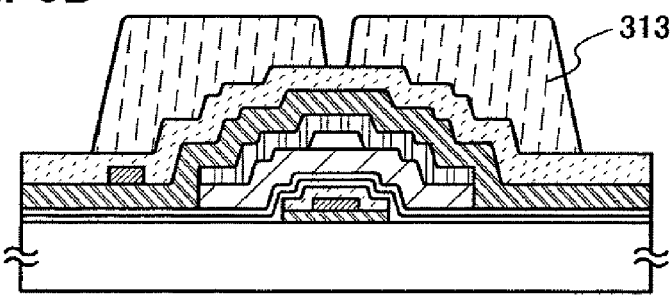
Figure 6E:
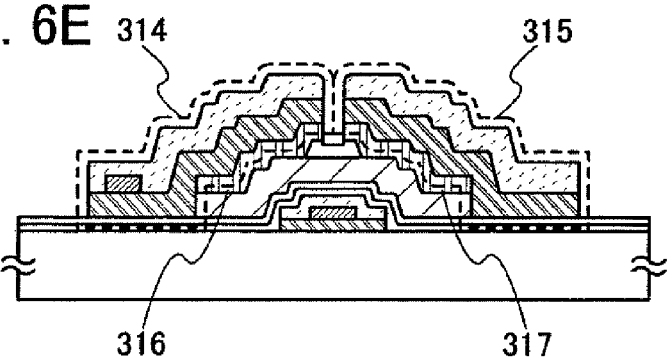

Then, a mask made of resist 313 is formed by a photolithography process (FIG. 6D). The fourth conductive film 312a, the sixth conductive film 312c, and the semiconductor layer 311 are processed into a desired shape through the mask 313 to form a first conductive layer 314 and a second conductive layer 315 serving as a source electrode layer or a drain electrode layer (and wires thereof) and a source region or a drain region 316, 317 (FIG. 6E).

For the mask, a commercial resist material containing a photosensitizing agent may be used. For example, a positive type resist or a negative type resist may be used. In using any of the materials, the surface tension and the viscosity can be controlled as appropriate by adjusting the concentration of a solvent, adding a surfactant, or the like.

In this embodiment mode, in the etching process, plasma etching (dry etching) or wet etching may be employed; however, plasma etching is suitable for processing a large-sized substrate. As an etching gas, a fluorine-based gas such as $CF_4$, $NF_3$, $SF_6$ or $CHF_3$, a chlorine-based gas typified by gases such as $Cl_2$, $BCl_3$, $SiCl_4$ or $CCl_4$, or $O_2$ gas is used, and an inert gas such as He or Ar may be added as appropriate.

Note that in the photolithography process of this embodiment mode, an insulating film having a thickness of about several nm may be formed on a surface of the semiconductor film before applying a resist. By this process, it is possible to prevent the semiconductor film from being in direct contact with the resist, and to prevent impurities from penetrating the semiconductor film.

Through the above described steps, a bottom gate type TFT in which the semiconductor film in the channel portion is not etched can be formed. In this embodiment mode, the source electrode layer or the drain electrode layer (and wires thereof) is formed from a low resistance material, and thus, resistance of the wires (electrodes) can be reduced. Note that the structure in which the conductive film 312b of the source electrode layer or the drain electrode layer (and wires thereof) is not formed over the semiconductor layer 310 is employed; however, the present invention is not limited to this structure, and the conductive film 312b may be formed over the semiconductor layer 310. A structure may be employed where in the wire 301 serving as a gate electrode, the second conductive film 301b is not formed under the semiconductor layer 310.

Figure 16A:
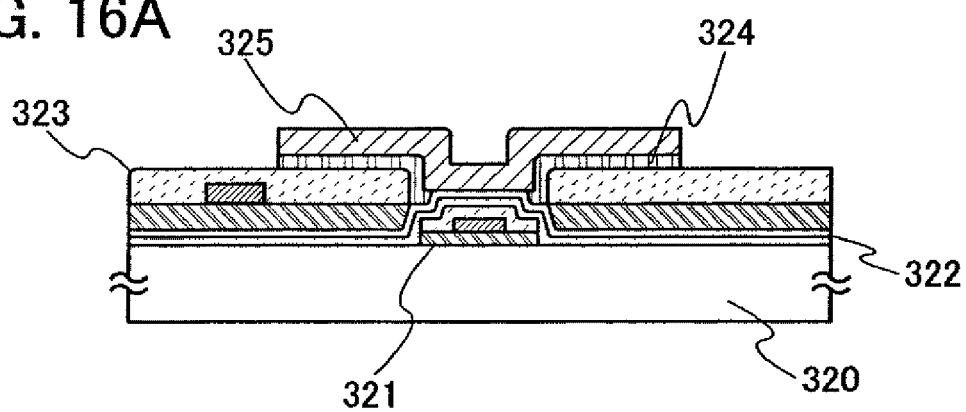
FIGS. 16A and 16B show semiconductor devices with other structures to be used for a display device according to an aspect of the present invention.

A bottom gate type TFT which has a different mode from the bottom gate type TFTs shown in FIGS. 5A to 5F and 6A to 6E can be formed. FIG. 16A shows an example of such a bottom gate type TFT. In the bottom gate type TFT shown in FIG. 16A, a wire 321 serving as a gate electrode, a gate insulating film 322, a source electrode layer or a drain electrode layer (and wires thereof) 323, a semiconductor film 324 doped with an impurity element, and a semiconductor film 325 are sequentially stacked over a substrate 320. In the bottom gate type TFT shown in the example of FIG. 16A, a conductive film is formed in accordance with Embodiment Mode 1 or Embodiment Mode 2, and thus, a bottom gate type TFT using a low resistance material as a wire can be formed.

In accordance with this embodiment mode, a bottom gate type TFT using a wire made of a low resistance material can be formed, and the problem of signal delay can be solved. Note that this embodiment mode can be freely combined with Embodiment Mode 1 or Embodiment Mode 2.

Embodiment Mode 5

Embodiment Mode 5 will describe a manufacturing method of a top-gate type thin film transistor (hereinafter referred to as a TFT) using a low resistance material as a wire or as an electrode, with reference to FIGS. 7A to 7E and 8A to 8D.

First, a base film 401 is formed over a substrate 400. As the substrate 400, a glass substrate formed from barium borosilicate glass, alumino borosilicate glass, or the like, or a silicon substrate, a plastic substrate or a resin substrate having heat resistance, or the like can be used. As a plastic substrate or a resin substrate, polyethylene terephthalate (PET), polyethylene naphthalate (PEN), polyethersulfone (PES), acrylic, polyimide, or the like can be used. The base film 401 is formed from a single layer or a stacked layer of an oxide material or a nitride material including silicon by a method such as a CVD method, a plasma CVD method, a sputtering method, or a spin coating method. The base film 401 has a function of preventing deterioration of a semiconductor film caused by contaminants from the substrate 400.

Subsequently, a semiconductor film 402 is formed over the base film 401 (FIG. 7A). The semiconductor film 402 may be formed with a thickness of 25 nm to 200 nm (preferably, 50 nm to 150 nm) by a sputtering method, an LPCVD method, a plasma CVD method, or the like. In this embodiment mode, an amorphous semiconductor film is used; however, the present invention is not limited to this, and a crystalline semiconductor film may be used.

Then, a mask made of resist is formed over the semiconductor film 402 by a photolithography process, and etching is carried out using the mask to form a semiconductor layer 403. For the mask, a commercial resist material containing a photosensitizing agent may be used. For example, a positive type resist, or a negative type resist may be used. Whichever material is used, the surface tension and the viscosity can be controlled as appropriate by adjusting the concentration of a solvent, adding a surfactant, or the like.

Note that in the photolithography process of this embodiment mode, an insulating film having a thickness of about several nm may be formed on a surface of the semiconductor film before applying a resist. By this process, it is possible to prevent the semiconductor film from being in direct contact with the resist, and to prevent impurities from penetrating the semiconductor film.

Then, a gate insulating film 404 and a gate insulating film 405 are formed to have a two-layer stacked structure over the semiconductor layer 403 (FIG. 7B). The stacked insulating films may be formed consecutively in the same chamber at the same temperature by changing reaction gases without breaking vacuum. By forming the insulting films consecutively without breaking vacuum, contamination of interfaces between the stacked films can be prevented. In this embodiment mode, the gate insulating film has a two-layer stacked structure; however, it may have a single layer structure or a stacked structure including three or more layers.

As materials of the gate insulating films 404 and 405, silicon oxide ($SiO_x$: x>0), silicon nitride ($SiN_x$: x>0), silicon oxynitride ($SiO_xN_y$: x>y>0), silicon nitride oxide ($SiN_xO_y$: x>y>0), or the like can be used as appropriate. Note that in order to form a dense insulating film with low gate leakage current at a low film formation temperature, it is preferable that a rare gas element such as argon is included in a reactive gas and mixed into the insulating film when the insulating film is formed. In this embodiment mode, a silicon oxide film is formed as the gate insulating film 404 to have a thickness of 10 nm to 100 nm (preferably, 20 nm to 80 nm), for example, a thickness of 60 nm, by using $SiH_4$ and $N_2O$ as a reactive gas. In this embodiment mode, a silicon nitride film is formed as the gate insulating film 405 to have a thickness of 10 nm to 100 nm (preferably, 20 nm to 80 nm), for example, 50 nm, by using $SiH_4$ and $NH_3$ as a reactive gas. Note that preferably, the gate insulating films 404 and 405 each have a thickness in the range of 10 nm to 100 nm; however the thickness is not limited to this range.

A wire 406 serving as a gate electrode is formed over the gate insulating film 405 by the method shown in Embodiment Mode 1 (FIG. 7C). The wire 406 includes a stacked structure of a first conductive film 406a, a second conductive film 406b, and a third conductive film 406c. A thickness of the wire 406 is preferably 10 nm to 200 nm. In this embodiment mode, the method shown in Embodiment Mode 1 is adopted as the formation method of the wire 406; however, the method shown in Embodiment Mode 2 may be adopted. This embodiment mode shows a manufacturing method of a single gate type TFT; however, a multigate structure in which two or more gate electrodes are provided may be adopted. By employing a multigate structure, a TFT with lower off-leakage current can be formed.

Next, an impurity element is added into the semiconductor layer 403, with the wire 406 serving as a gate electrode as a mask (FIG. 7D). Here, for example, phosphorus (P) is added as an impurity element at a concentration of about $5\times10^{19}$ to $5\times10^{20}/cm^3$. Thereby, an n-type semiconductor film can be formed. Alternatively, by adding an impurity element having a p-type conductivity, a p-type semiconductor film may be formed. As the impurity element having an n-type conductivity, phosphorus (P), arsenic (As), or the like can be used. As the impurity element having a p-type conductivity, boron (B), aluminum (Al), gallium (Ga), or the like can be used. In addition, an LDD (Lightly Doped Drain) region doped with an impurity element added at a low concentration may be formed. By forming such an LDD region, a deterioration of a TFT due to hot-carrier injection can be prevented. The wire formed according to an aspect of the present invention has a stacked structure, and the thickness of the wire differs depending on whether or not the second conductive film is included in the wire. Thus, by utilizing this fact, an LDD region 412 can be formed in a self-aligned manner (FIG. 7E). The structure shown in FIG. 7E in which the gate electrode overlaps with the LDD region may be called as a GOLD (Gate overlapped LDD) structure.

Figure 8A:
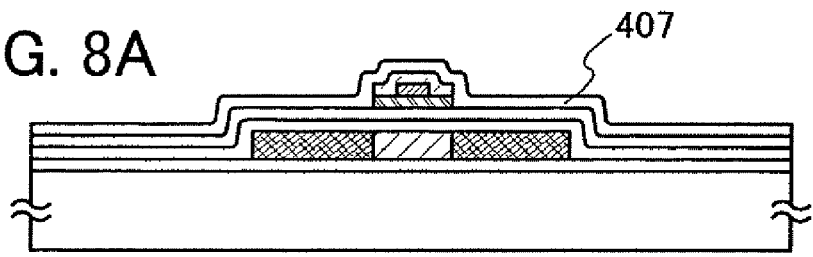
FIGS. 8A to 8D show a manufacturing process of a semiconductor device to be used for a display device according to an aspect of the present invention.

Then, an insulating film 407 is formed so as to cover the gate insulating film 405 and the wire 406 serving as a gate electrode (FIG. 8A). As a material of the insulating film 407, silicon oxide ($SiO_x$: x>0), silicon nitride ($SiN_x$: x>0), silicon oxynitride ($SiO_xN_y$: x>y>0), silicon nitride oxide ($SiN_xO_y$: x>y>0), or the like can be used as appropriate. In this embodiment mode, the gate insulating film has a two-layer stacked structure; however, it may have a single layer structure or a stacked structure including three or more layers. Further, an interlayer insulating film with a single layer or two or more layers may be provided over the insulating film 407.

Figure 8B:
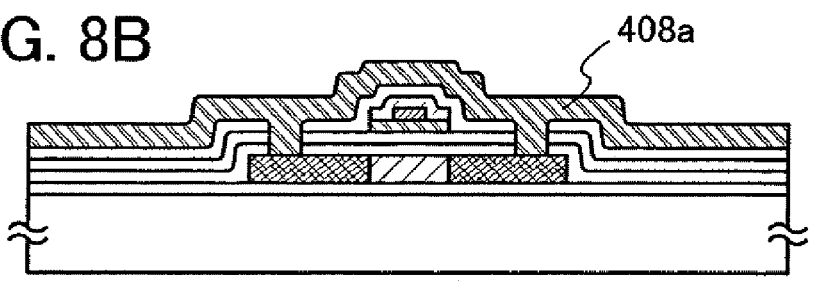

Then, a mask made of resist is formed by a photolithography process, and the gate insulating films 404 and 405 and the insulating film 407 are etched to form opening portions such that the region of the semiconductor layer 403 into which an impurity element has been added is exposed. After that, a fourth conductive film 408a which serves as a barrier film is formed so as to be electrically connected to the semiconductor layer 403 (FIG. 8B).

A fifth conductive film 408b made of a low resistance material is formed in a region which is to become a wire later, which is over the fourth conductive film 408a, and a sixth conductive film 408c serving as a barrier film is formed so as to cover the fifth conductive film 408b. At this time, the fifth conductive film 408b can be formed by the method shown in Embodiment Mode 1. This embodiment mode adopts the method shown in Embodiment Mode 1, but may employ the method shown in Embodiment Mode 2.

Figure 8C:
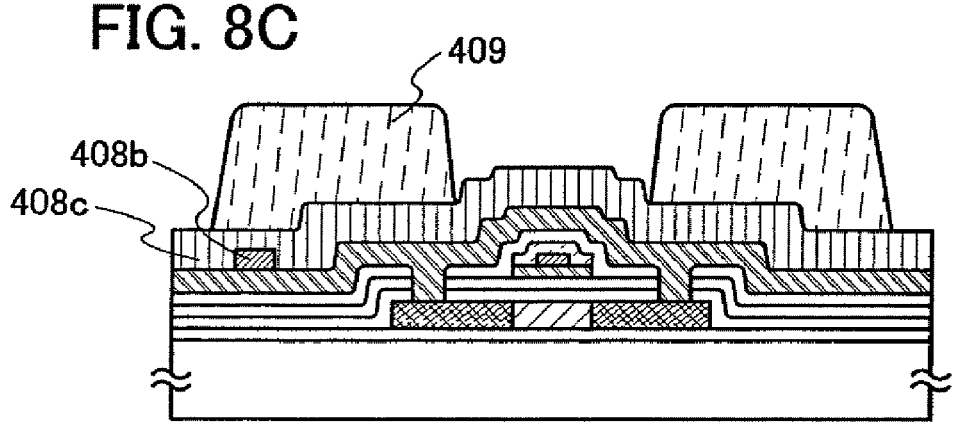
Figure 8D:
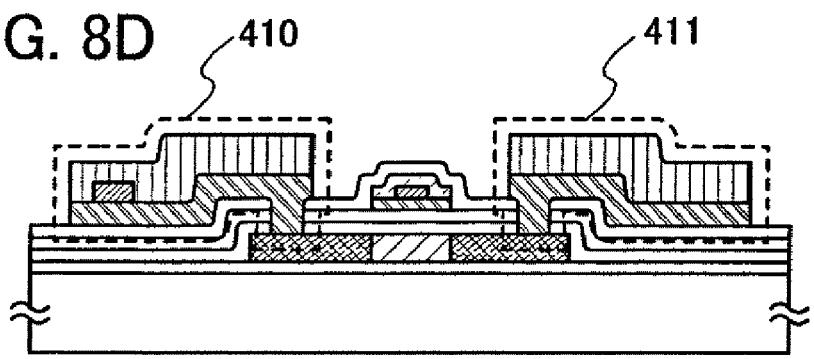

Then, a mask 409 made of resist is formed by a photolithography process (FIG. 8C). The fourth conductive film 408a and the sixth conductive film 408c are processed into a desired shape through the mask 409 to form the first conductive layer 410 and the second conductive layer 411 which serve as a source electrode layer or a drain electrode layer (and wires thereof) (FIG. 8D).

In this embodiment mode, in the etching process, plasma etching (dry etching) or wet etching may be employed; however, plasma etching is suitable for processing a large-sized substrate. As an etching gas, a fluorine-based gas such as $CF_4$, NF$_3$, SF$_6$ or CHF$_3$, a chlorine-based gas typified by gases such as Cl$_2$, BCl$_3$, SiCl$_4$ or CCl$_4$, or O$_2$ gas is used, and an inert gas such as He or Ar may be added as appropriate.

Through the above described steps, a top gate type TFT can be formed.

Figure 16B:
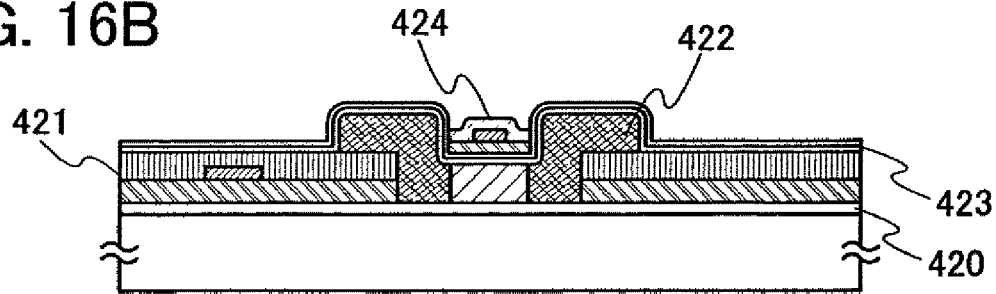

A top gate type TFT having a different mode from that shown in FIGS. 7A to 7E and 8A to 8D can also be formed. FIG. 16B shows an example of such a top gate type TFT. In the top gate type TFT shown in FIG. 16B, a source electrode layer or a drain electrode layer (and wires thereof) 421, a semiconductor film 422, a gate insulating film 423, and a wire 424 serving as a gate electrode are sequentially stacked over a base film 420. In the top gate type TFT shown in the example of FIG. 16B, the conductive film is formed in accordance with Embodiment Mode 1 or Embodiment Mode 2, and thus, a top gate type TFT using a low resistance material as a wire can be formed.

In accordance with this embodiment mode, a top gate type TFT using a wire made of a low resistance material can be formed, and the problem of signal delay can be solved. In this embodiment mode, the source electrode layer or the drain electrode layer (and the wires thereof) is also formed from the wire made of a low resistance material; however, a structure in which only a wire serving as a gate electrode is wire made of a low resistance material may be employed. In this embodiment mode, a structure in which a conductive film 408b in the source electrode layer or the drain electrode layer (and the wires thereof) is not formed over the semiconductor layer 403 is employed; however, the present invention is not limited to this, and a structure in which a conductive film 408b is formed over the semiconductor layer 403 may be employed. In addition, in the wire 406 serving as a gate electrode, the second conductive film 406b is not necessarily formed over the semiconductor layer 403. This embodiment mode can be freely combined with Embodiment Mode 1 and/or Embodiment Mode 2.

Embodiment Mode 6

Figure 9A:
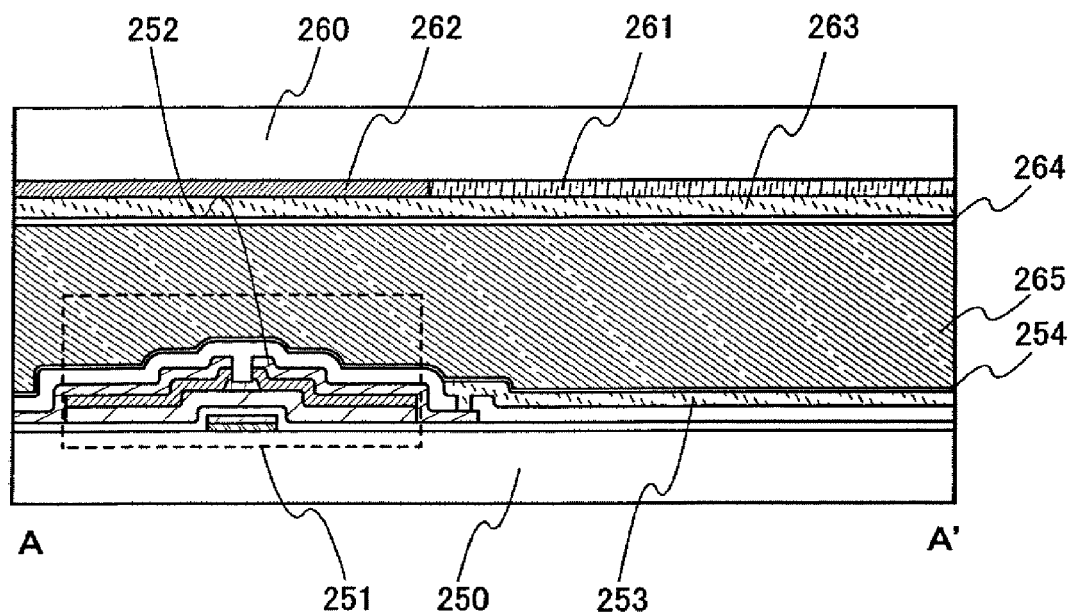
FIGS. 9A and 9B show a liquid crystal display device according to an aspect of the present invention.
Figure 9B:
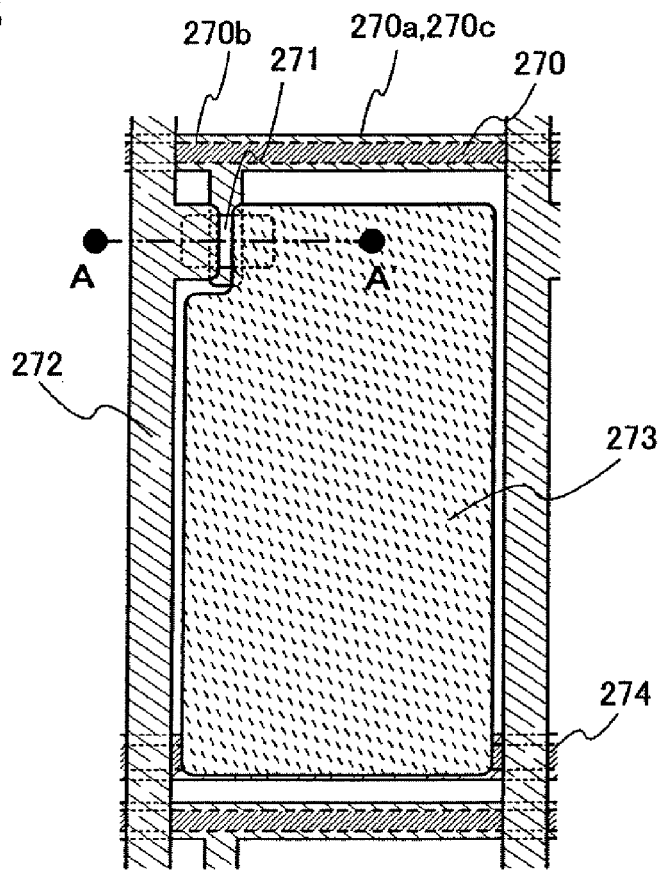

Embodiment Mode 6 will describe a manufacturing method of a liquid crystal panel using a low resistance material as a wire, with reference to FIGS. 9A and 9B.

A bottom gate type TFT 251 is formed over a substrate 250 by the method shown in Embodiment Mode 3. In this embodiment mode, the bottom gate type TFT 251 is formed by the method shown in Embodiment Mode 3; however, the present invention is not limited to this method. There is no particular limitation on conductivity and either an n-channel TFT or a p-channel TFT may be formed. As a semiconductor film, an amorphous semiconductor or a crystalline semiconductor may be employed. As the substrate 250, a glass substrate formed from barium borosilicate glass, alumino borosilicate glass, or the like, a silicon substrate, a plastic substrate or a resin substrate having heat resistance, or the like can be used. As a plastic substrate or a resin substrate, polyethylene terephthalate (PET), polyethylene naphthalate (PEN), polyethersulfone (PES), acrylic, polyimide, or the like can be used.

Although not shown in this embodiment mode, a multigate structure may be employed as a structure for reducing off-leakage current.

A top gate type TFT may be adopted instead of the bottom gate type TFT. However, in forming a bottom gate type TFT, a TFT using a low resistance material can be manufactured with a smaller number of steps than in forming a top gate type TFT. Accordingly, a high performance liquid crystal panel can be manufactured at low cost. As a formation method of a top gate type TFT, the method of Embodiment Mode 5 can be adopted. However, as long as a wire having a structure in which a low resistance material is covered with a barrier film is employed, there is no particular limitation, and a TFT having any structure can be used.

Next, a pixel electrode 253 is formed so as to be electrically connected to a source electrode or a drain electrode 252. The pixel electrode 253 in this embodiment mode corresponds to the electrode 212 in FIG. 4C of Embodiment Mode 3. As a material of the pixel electrode, indium tin oxide (ITO) in which tin oxide is mixed into indium oxide, indium tin silicon oxide (ITSO) in which silicon oxide is mixed into indium tin oxide (ITO), indium zinc oxide (IZO) in which zinc oxide is mixed into indium oxide, zinc oxide (ZnO), tin oxide (SnO$_2$), or the like can be used. Indium zinc oxide (IZO) is a transparent conductive material formed by a sputtering method using a target in which zinc oxide (ZnO) of 2 to 20 wt % is mixed into indium oxide. In forming a reflective type liquid crystal panel, a metal material such as aluminum (Al) can also be used for the pixel electrode.

Then, an insulating film 254 serving as an orientation film is formed to cover an entire surface of the substrate 250 including the TFT 251 and the pixel electrode 253. As a material of the insulating material serving as an orientation film, for example, polyimide resin in which polyamic acid is dissolved in a solvent in which N-methyl-2-pyrrolidone or the like and Cellosolve acetate or the like are mixed, or a polyimide resin in which polyamic acid is imidized and dissolved in a solvent, or the like can be used. A screen printing method, an off-set printing method, a spin coating method, a droplet discharging method, or the like can be used as a formation method. The thickness may, for example, be greater than or equal to 20 nm and less than or equal to 70 nm, preferably, greater than or equal to 30 nm and less than or equal to 60 nm. A surface of the thus formed insulating film 254 is subjected to an orientation treatment in a predetermined direction, in other words, is rubbed with a rubbing cloth such as felt or cotton.

Then, a color filter 261, a light-shielding film 262, a common electrode 263, and an orientation film 264 are stacked over an opposite substrate 260. The color filter 261 may be formed using materials exhibiting red (R), green (G) and blue (B) in the case of full color display. In the case of mono color display, the color filter may be formed using a material emitting at least one color. The color filter 261 may have a structure in which color conversion layers are stacked. In general, the light-shielding film 262 is formed from a metal film or an organic film including a black pigment. As a material of the common electrode 263, similarly to the material of the pixel electrode, indium tin oxide (ITO) in which tin oxide is mixed into indium oxide, indium tin silicon oxide (ITSO) in which silicon oxide is mixed into indium tin oxide (ITO), indium zinc oxide (IZO) in which zinc oxide is mixed into indium oxide, zinc oxide (ZnO), tin oxide (SnO$_2$), or the like can be used, for example. Indium zinc oxide (IZO) is a transparent conductive material formed by a sputtering method using a target in which zinc oxide (ZnO) of 2 to 20 wt % is mixed into indium oxide. Similarly to the pixel electrode, a metal material such as aluminum (Al) may also be used.

Next, the opposite substrate 260 over which the color filter or the like is stacked is attached to the substrate 250 over which the TFT 251 or the like is formed by a sealing material (not shown). The light-shielding film 262 is arranged so as to overlap with the TFT, and the color filter 261 is arranged so as to overlap with the pixel electrode 253. After that, the liquid crystal panel is completed by injecting a liquid crystal 265 (FIG. 9A). In FIG. 9A, polarizing plates which are not shown in FIG. 9A are attached to the lower side of the substrate 250 and the upper side of the opposite substrate 260. Through the above described steps, a liquid crystal panel is completed.

Next, a structure of a pixel portion of the liquid crystal panel in this embodiment mode is described, with reference to FIG. 9B. FIG. 9B is an example of a top view of the liquid crystal panel, and a cross sectional view taken along A-A' of FIG. 9B corresponds to A-A' of FIG. 9A.

The semiconductor layer 271 overlaps the gate wire 270, and the overlapping portion becomes a gate electrode. In other words, reference numeral 270 indicates both the gate wire and the gate electrode. The source wire (or drain wire) 272 and the pixel electrode 273 are electrically connected to the semiconductor layer 271, and a signal from the source wire (or drain wire) 272 is input into the pixel electrode 273 through the semiconductor layer 271. Similarly to the relation between the gate wire and the gate electrode, a portion of the source wire (or drain wire) 272 which is overlapped with the semiconductor layer 271 becomes a source electrode (or drain electrode). In other words, reference numeral 272 indicates both the source wire (or drain wire) and the source electrode (or drain electrode). The capacitor wire 274 forms a capacitor in a portion where it overlaps with the pixel electrode 273. The capacitor wire 274 may be formed in the same layer as the gate wire 270, or in a different layer. When the capacitor wire is formed from the same layer as the gate wire, a low resistance material is used, similarly to the gate wire, and thus, a capacitor wire with reduced resistance can be formed. In this case, Embodiment Mode 1 or Embodiment Mode 2 may be employed to form the capacitor wire, as appropriate.

The gate wire 270 is formed such that the conductive film 270b made of a low resistance material is covered by the conductive films 270a and 270c which serve as the barrier film. By employing such a structure, contamination of the semiconductor layer 271 due to an element having mobility can be prevented. In this embodiment mode, the conductive film 270b in the gate wire 270 is not formed under the semiconductor layer 271; however, the present invention is not limited to this structure, and it may be formed under the semiconductor layer 271.

By employing this embodiment mode, a low resistance material can be formed as a wire, and thus, a liquid crystal panel with reduced signal delay can be manufactured. Since wire resistance is reduced, a liquid crystal panel which can consume less electric power and operate at high speed can be manufactured. As shown in this embodiment mode, by employing a structure in which a low resistance material is used for a gate wire (and a capacitor wire) but is not used for a source wire and other wires, the above highly advantageous effects can be obtained with minimum increase in the number of steps. This embodiment mode can be freely combined with any of Embodiment Modes 1 to 5.

Embodiment Mode 7

Figure 10A:
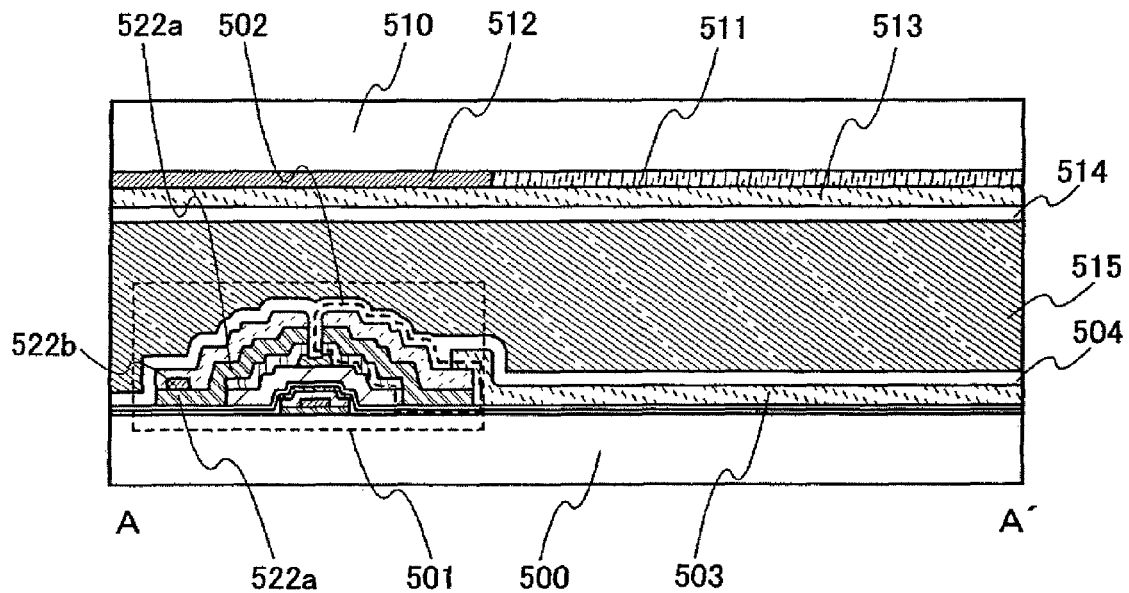
FIGS. 10A and 10B show a liquid crystal display device according to an aspect of the present invention.
Figure 10B:
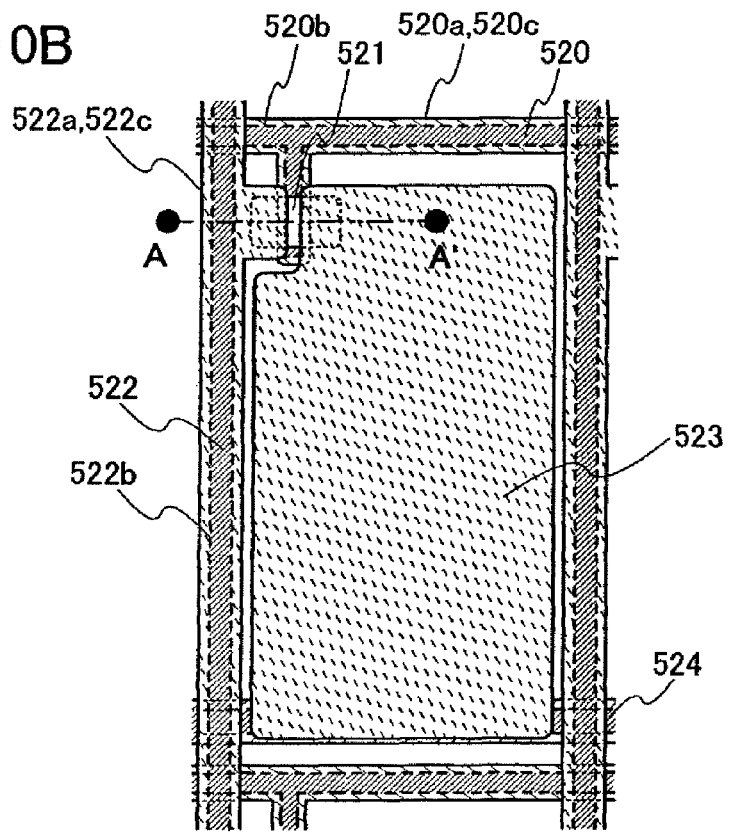

Embodiment Mode 7 will describe a manufacturing method of a liquid crystal panel using a low resistance material as a wire or an electrode, with reference to FIGS. 10A and 10B.

A bottom gate type TFT 501 is formed over a substrate 500 by the method shown in Embodiment Mode 4. This embodiment mode employs the method shown in Embodiment Mode 4 to form the bottom gate type TFT 501; however, the present invention is not limited to this. There is no particular limitation on conductivity and either an n-channel TFT or a p-channel TFT may be formed. In addition, an amorphous semiconductor or a crystalline semiconductor may be used as a semiconductor film. As the substrate 500, a glass substrate formed from barium borosilicate glass, alumino borosilicate glass, or the like, or a silicon substrate, a plastic substrate or a resin substrate having heat resistance, or the like can be used. As a plastic substrate or a resin substrate, polyethylene terephthalate (PET), polyethylene naphthalate (PEN), polyethersulfone (PES), acrylic, polyimide, or the like can be used. After forming a TFT, an interlayer insulating film may be formed as a planarizing film, and a wire which is electrically connected to the source electrode or the drain electrode may be formed over the interlayer insulating film.

Although not shown in this embodiment mode, a multigate structure may be employed, so as to reduce off-leakage current.

A top gate type TFT may be adopted instead of the bottom gate type TFT. However, in forming the bottom gate type TFT, a TFT using a low resistance material can be manufactured with a smaller number of steps than in forming the top gate type TFT. Accordingly, a high performance liquid crystal panel can be manufactured at low cost. As a manufacturing method of a top gate type TFT, the method of Embodiment Mode 4 can be adopted. However, as long as a wire having a structure in which a low resistance material is covered with a barrier film is employed, there is no particular limitation, and a TFT having any structure can be used.

Next, a pixel electrode 503 is formed so as to be electrically connected to a source electrode or a drain electrode 502. As a material of the pixel electrode, for example, indium tin oxide (ITO) in which tin oxide is mixed into indium oxide, indium tin silicon oxide (ITSO) in which silicon oxide is mixed into indium tin oxide (ITO), indium zinc oxide (IZO) in which zinc oxide is mixed into indium oxide, zinc oxide (ZnO), tin oxide ($SnO_2$), or the like can be used. Indium zinc oxide (IZO) is a transparent conductive material formed by a sputtering method using a target in which zinc oxide (ZnO) at 2 to 20 wt % is mixed into indium oxide.

Besides the above described electrode materials, amorphous silicon or crystalline silicon (including polycrystalline silicon) doped with an impurity element may be used. By forming an electrode using amorphous silicon or crystalline silicon (including polycrystalline silicon) at the same time as a source region or a drain region of a TFT is formed, the number of steps can be reduced. In forming a reflective type liquid crystal panel, a metal material such as aluminum (Al) can also be used for the pixel electrode.

An insulating film 504 serving as an orientation film is formed so as to cover an entire surface of the substrate 500 including the TFT 501 and the pixel electrode 503. As an insulating material serving as an orientation film, for example, polyimide resin in which polyamic acid is dissolved in a solvent in which N-methyl-2-pyrrolidone or the like and Cellosolve acetate or the like are mixed, or a polyimide resin in which polyamic acid is imidized and dissolved in a solvent, or the like can be used. A screen printing method, an off-set printing method, a spin coating method, a droplet discharging method, or the like can be used as a formation method. The thickness may, for example, be greater than or equal to 20 nm and less than or equal to 70 nm, preferably, greater than or equal to 30 nm and less than or equal to 60 nm. A surface of the thus formed insulating film 504 is subjected to an orientation treatment in a desired direction, in other words, is rubbed with a rubbing cloth such as felt or cotton.

Then, a color filter 511, a light-shielding film 512, a common electrode 513, and an orientation film 514 are stacked over an opposite substrate 510. The color filter 511 may be formed using materials exhibiting red (R), green (G) and blue (B) in the case of full color display. In the case of mono color display, the color filter may be formed using a material exhibiting at least one color. The color filter 511 may include a structure in which color conversion layers are stacked. In general, the light-shielding film 512 is formed from a metal film or an organic film including a black pigment. As a material of the common electrode 513, similarly materials as those for the pixel electrode can be used, for example, indium tin oxide (ITO) in which tin oxide is mixed into indium oxide, indium tin silicon oxide (ITSO) in which silicon oxide is mixed into indium tin oxide (ITO), indium zinc oxide (IZO) in which zinc oxide is mixed into indium oxide, zinc oxide (ZnO), tin oxide ($SnO_2$), or the like. Indium zinc oxide (IZO) is a transparent conductive material formed by a sputtering method using a target in which zinc oxide (ZnO) of 2 to 20 wt % is mixed into indium oxide. Similarly to the case of the pixel electrode, amorphous silicon or crystalline silicon which is doped with an impurity element, or a metal material such as aluminum (Al) may also be used.

Next, the opposite substrate 510 over which the color filter 511 and the like are stacked is attached to the substrate 500 over which the TFT 501 and the like is formed by a sealing material (not shown). The light-shielding film 512 is arranged so as to overlap with the TFT, and the color filter 511 is arranged so as to overlap with the pixel electrode 503. After that, the liquid crystal panel is completed by injecting a liquid crystal 515 (FIG. 10A). In FIG. 10A, polarizing plates, which are not shown in FIG. 10A, are attached to the lower side of the substrate 500 and the upper side of the opposite substrate 510. Through the above described steps, a liquid crystal panel is completed.

Next, a structure of a pixel portion of the liquid crystal panel in this embodiment mode is described, with reference to FIG. 10B. FIG. 10B is an example of a top view of the liquid crystal panel, and a cross sectional view taken along A-A' of FIG. 10B corresponds to A-A' of FIG. 10A.

The semiconductor layer 521 overlaps the gate wire 520, and the overlapping portion becomes a gate electrode. In other words, reference numeral 520 indicates both the gate wire and the gate electrode. The source wire (or drain wire) 522 and the pixel electrode 523 are electrically connected to the semiconductor layer 521, and a signal from the source wire (or drain wire) 522 is input into the pixel electrode 523 through the semiconductor layer 521. Similarly to the relationship between the gate wire and the gate electrode, a portion of the source wire (or drain wire) 522 which overlaps with the semiconductor layer 521 becomes a source electrode (or drain electrode). In other words, reference numeral 522 indicates both the source wire (or drain wire) and the source electrode (or drain electrode). In a portion where a capacitor wire 524 overlaps with the pixel electrode 523, a capacitor is formed. The capacitor wire 524 may be formed in the same layer as the gate wire 520, or in a different layer. When the capacitor wire is formed from the same layer as the gate wire, a low resistance material is used, similarly to the case of the gate wire, and thus, a capacitor wire with reduced resistance can be formed. In this case, Embodiment Mode 1 or Embodiment Mode 2 may be employed as appropriate to form the capacitor wire.

The gate wire 520 is formed such that the conductive film 520b made of a low resistance material is covered with the conductive films 520a and 520c which serve as the barrier film, and the source wire (or drain wire) 522 is formed such that a conductive film 522b made of a low resistance material is covered with the conductive films 522a and 522c which serve as the barrier film. By employing such a structure, contamination of the semiconductor layer 521 due to an element having mobility can be prevented. In this embodiment mode, the conductive film 522b in the source wire (or drain wire) 522 is not formed over the semiconductor layer 521; however, the present invention is not limited to this, and it may be formed over the semiconductor layer 521. Further, a structure in which in the gate wire 520, the conductive layer 520b is not formed under the semiconductor layer 521 may also be employed.

By employing this embodiment mode, a low resistance material can be formed as a wire, and thus, a liquid crystal panel with reduced signal delay can be manufactured. Since wire resistance is reduced, a liquid crystal panel which has low power consumption and operates at high speed can be manufactured. As shown in this embodiment mode, by employing a structure in which a low resistance material is used for not only a gate wire (and a capacitor wire) but also a source wire, resistance of the source wire can be reduced, thereby magnifying the above advantageous effects. This embodiment mode can be freely combined with any of Embodiment Modes 1 to Embodiment Mode 5.

Embodiment Mode 8

Figure 11A:
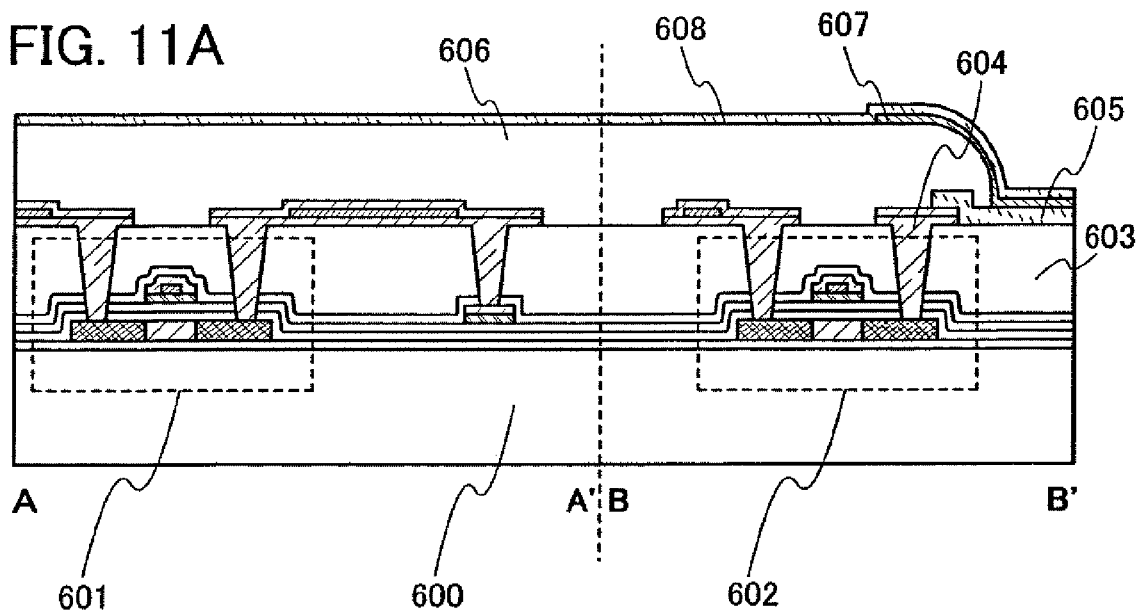
FIGS. 11A and 11B show an EL display device according to an aspect of the present invention.
Figure 11B:
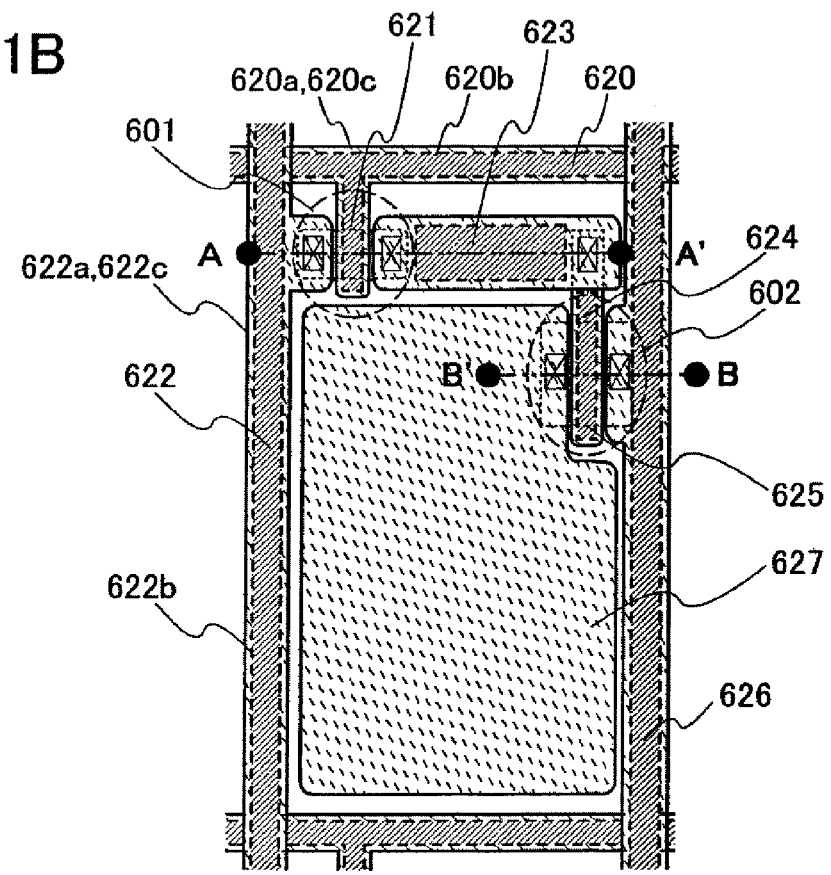

Embodiment Mode 8 will describe a manufacturing method of an electroluminescence panel (hereinafter, referred to as an EL panel) using a low resistance material as a wire or an electrode, with reference to FIGS. 11A and 11B.

Top gate type TFTs 601 and 602 are formed over a substrate 600 by the method shown in Embodiment Mode 5. Here, the top gate type 601 serves as a switching TFT and the top gate type TFT 602 serves as a driving TFT. This embodiment mode adopts Embodiment Mode 5 to form the top gate type TFT; however, the present invention is not limited to this. There is no particular limitation on conductivity and either an n-channel TFT or a p-channel TFT may be formed. In addition, an amorphous semiconductor or a crystalline semiconductor may be used as a semiconductor film. Note that in this embodiment mode, a source electrode (source wire) or a drain electrode (drain wire) is formed after forming an interlayer insulating film 603 (FIG. 11A).

As the substrate 600, a glass substrate formed from barium borosilicate glass, alumino borosilicate glass, or the like, or a silicon substrate, a plastic substrate or a resin substrate having heat resistance, or the like can be used. As a plastic substrate or a resin substrate, polyethylene terephthalate (PET), polyethylene naphthalate (PEN), polyethersulfone (PES), acrylic, polyimide, or the like can be used.

The interlayer insulating film 603 can be formed by using an organic resin film, an inorganic insulating film, or an insulating film including a Si—O—Si bond formed with a siloxane material as a starting material (hereinafter, referred to as a "siloxane based insulating film"). Note that siloxane has a skeleton structure formed by a bond of silicon (Si) and oxygen (O), in which an organic group containing at least hydrogen (such as an alkyl group or aromatic hydrocarbon) is used as a substituent. Alternatively, a fluoro group may be used as the substituent. Further, an organic group containing at least hydrogen and a fluoro group may be used as substituents. For the interlayer insulating film 603, a so-called low dielectric constant material (low-k material) may also be used. Cross sections of A-A' and B-B' of FIG. 11A correspond to cross sections taken along A-A' and B-B' of FIG. 11B.

A TFT having a plurality of LDD regions may be used so as to reduce off-leakage current. In addition, a TFT having a multigate structure may also be used.

A bottom gate type TFT may be adopted instead of the top gate type TFT. In forming the bottom gate type TFT, a TFT using a low resistance material can be formed with a smaller number of steps than in forming the top gate type TFT. Accordingly, a high performance EL panel can be manufactured at low cost. As a formation method of a bottom gate type TFT, the method of Embodiment Mode 3 can be adopted. However, as long as a wire having a structure in which a low resistance material is covered with a barrier film is employed there is no particular limitation, and a TFT having any structure can be used. Further, a structure in which a plurality of interlayer insulating films are formed or a structure in which no interlayer insulating films are formed may be employed.

A pixel electrode 605 which is electrically connected to a source electrode or a drain electrode 604 is formed. As a material of the pixel electrode, in a case where a bottom emission type EL panel or a dual emission type EL panel is formed, indium tin oxide (ITO) in which tin oxide is mixed into indium oxide, indium tin silicon oxide (ITSO) in which silicon oxide is mixed into indium tin oxide (ITO), indium zinc oxide (IZO) in which zinc oxide is mixed into indium oxide, zinc oxide (ZnO), tin oxide ($SnO_2$), or the like can be used. Indium zinc oxide (IZO) is a transparent conductive material formed by a sputtering method using a target in which zinc oxide (ZnO) of 2 to 20 wt % is mixed into indium oxide.

As a pixel electrode material of a top emission type EL panel, aluminum, an alloy of magnesium and silver (Mg—Ag), or the like can be used.

After that, an insulating film 606 serving as a partition wall is formed over the TFT. The insulating film 606 is formed so as to expose a part of the pixel electrode 605. In addition, the insulating film 606 is formed so as to cover a portion in which the source electrode or the drain electrode 604 and a pixel electrode 605 are connected. If the portion in which the source electrode or the drain electrode 604 and a pixel electrode 605 are connected is not covered by the insulating film 606 and exposed, a defect such as short-circuiting between the pixel electrode 605 and a common electrode 608 which will be formed later may occur. On the other hand, the insulating film 606 is formed to so as to have a curved surface near a region in which the pixel electrode 605 is exposed, by successively reducing the film thickness. This is done so as to prevent disconnection of an electroluminescent layer formed over the pixel electrode 605 and the insulating film 606 caused by a step of the insulating film 606. The insulating film 606 can be formed using organic resin, inorganic insulating material or a siloxane based insulting material. As the organic resin, acrylic, polyimide, polyamide or the like can be used, and as the inorganic insulating material, silicon oxide, silicon nitride oxide, or the like can be used. As a formation method, a spin coating method, an application method or the like can be used.

Then, the electroluminescent layer 607 is formed so as to be in contact with the pixel electrode 605 exposed through the insulating film 606, and then, a common electrode 608 is formed. As a structure of the electroluminescent layer 607, a single layer structure with just a light-emitting layer may be used, or a structure in which a hole injecting layer, a hole transporting layer, an electron transporting layer, an electron injecting layer, and the like are provided may be used. The structure of the electroluminescent layer 607 is not limited to a stacked structure in which a hole injecting layer, a hole transporting layer, a light emitting layer, an electron transporting layer, an electron injecting layer and the like are clearly distinct from one another. In other words, the structure may include a layer in which adjacent materials among a hole injecting layer, a hole transporting layer, a light emitting layer, an electron transporting layer, an electron injecting layer and the like are mixed.

For the electroluminescent layer 607, a material which generates luminescence (fluorescence) at the time of transition from a singlet exciton to a ground state or luminescence (phosphorescence) at the time of transition from a triplet exciton to a ground state, may be used. The electroluminescent layer 607 may be formed from a layer made from an inorganic material or from a layer in which an inorganic material is mixed.

When a bottom emission type EL panel is manufactured, aluminum, an alloy of magnesium and silver (Mg—Ag) or the like can be used as a material of the common electrode. On the other hand, in a case where a top emission type EL or a dual emission type EL panel is manufactured, indium tin oxide (ITO) in which tin oxide is mixed into indium oxide, indium tin silicon oxide (ITSO) in which silicon oxide is mixed into indium tin oxide (ITO), indium zinc oxide (IZO) in which zinc oxide is mixed into indium oxide, zinc oxide (ZnO), tin oxide ($SnO_2$), or the like can be used as a material of the common electrode 608.

Next, a structure of a pixel portion in an EL panel of this embodiment mode will be described with reference to FIG. 11B. FIG. 11B shows an example of a top view of an EL panel, and cross sections of A-A' and B-B' of FIG. 11B correspond to the cross sections taken along A-A' and B-B' of FIG. 11A.

A gate wire 620 overlaps the semiconductor layer 621 and the overlapping portion becomes a gate electrode of the tope gate type TFT 601. In other words, reference numeral 620 indicates both the gate wire and the gate electrode. A source wire (or drain wire) 622 is electrically connected to one of either a source or a drain of the semiconductor layer 621, and a wire 624 serving as a gate electrode of a TFT 602 is electrically connected to the other of either the source or the drain through a connection wire 623. Note that the wire 624 serving as a gate electrode is arranged so as to overlap with the semiconductor layer 625. Further, a power supply line 626 is electrically connected to one of either a source or a drain of the semiconductor layer 625, and a pixel electrode 627 is electrically connected to the other of either the source or the drain. Similarly to the relation between the gate wire and the gate electrode, a portion of a source wire (or drain wire) 622 that overlaps with semiconductor layer 621 becomes a source electrode (or drain electrode). In other words, reference numeral 622 indicates both a source wire (or drain wire) and a source electrode (or drain electrode).

The gate wire 620 is formed such that the conductive film 620b made of a low resistance material is covered with the conductive films 620a and 620c which serve as the barrier film, and the source wire (or drain wire) 622 is formed such that the conductive film 622b made of a low resistance material is covered with the conductive films 622a and 622c which serve as the barrier film. In addition, the connection wire 623, the wire 624 serving as a gate electrode, and the power supply line 626 have a structure in which the conductive film made of a low resistance material is covered with the conductive film serving as a barrier film. By employing such a structure, contamination of the semiconductor layers 621 and 625 caused by an element having mobility can be prevented. In this embodiment mode, a structure is employed in which low resistance materials are used for the gate wire 620, the source wire (or drain wire) 622, the connection wire 623, the wire 624 serving as a gate electrode, and the power supply line 626; however, the present invention is not limited to this, and a structure in which low resistance material is used for only the gate wire 620 may be employed. Moreover, in this embodiment mode, the conductive film 622*b* in the source wire (or drain wire) 622 is not formed over the semiconductor layer 621; however, the conductive film 622*b* may be formed over the semiconductor layer 621. In addition, the gate wire 620 may employ a structure in which the conductive film 620*b* is not formed over the semiconductor layer 621.

By employing this embodiment mode, an EL panel using a low resistance material as a wire can be manufactured. In accordance with this embodiment mode, since a low resistance material can be used for a wire, an EL panel with reduced signal delay can be manufactured. Since wire resistance is reduced, an EL panel which has low power consumption and can operate at high speed can be manufactured. In the EL panel, while a pixel emits light, a current constantly flows, and thus, it is extremely effective to use a low resistance material as a power supply line in terms of low power consumption. This embodiment mode can be freely combined with Embodiment Modes 1 to 5.

Embodiment Mode 9

Figure 12A:
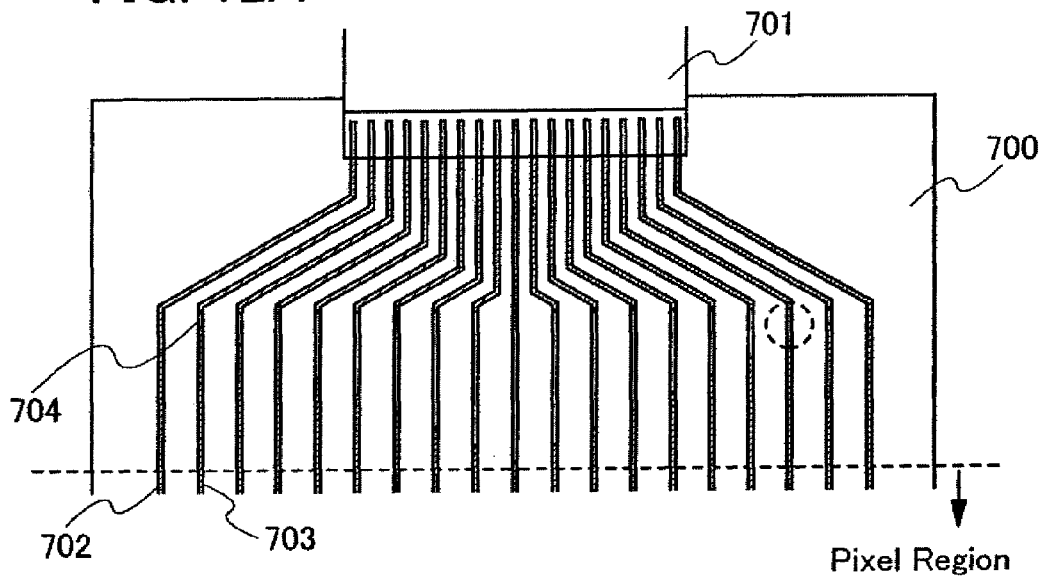
FIGS. 12A to 12C show leading wires to be used for a display device according to an aspect of the present invention.
Figure 12B:
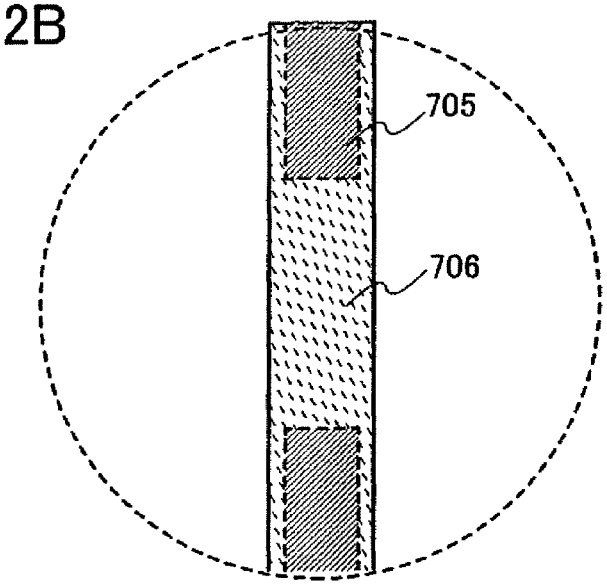
Figure 12C:
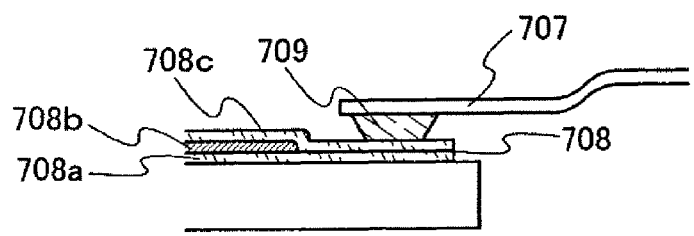
Figure 13A:
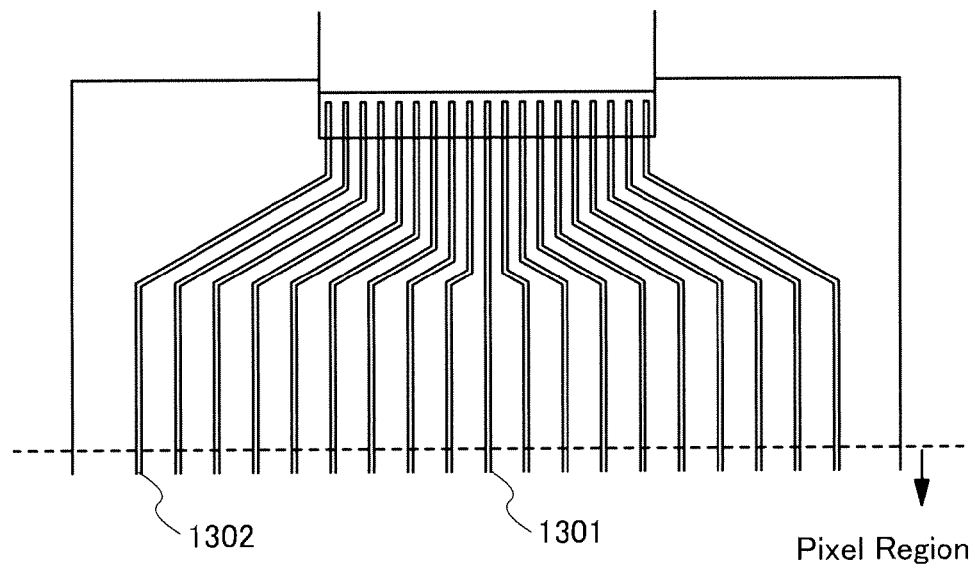
FIGS. 13A and 13B show leading wires used for a conventional display device.
Figure 13B:
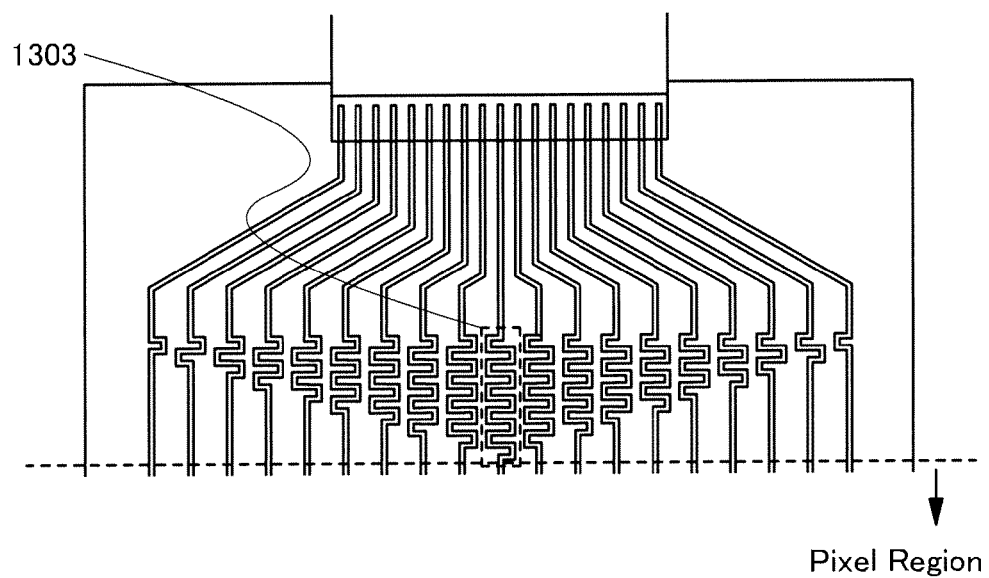

Embodiment Mode 9 will describe a structure of a display device that has reduced signal delay by using a low resistance wire shown in Embodiment Modes 1 and 2 with reference to FIGS. 12A to 12C.

FIG. 12A shows leading wires (a leading wirings) using a low resistance material which are formed over a substrate 700 of a panel which is formed in any of Embodiment Modes 6 to 8. The leading wires are connected to a driver circuit through an FPC (flexible Printed Circuit) 701. Note that a portion below a broken line is a pixel region.

Leading wires using a low resistance material are formed in accordance with Embodiment Mode 1, Embodiment Mode 2 or the like. At that time, each of the leading wires is formed so as to have almost equal resistance value regardless of the lengths of the wires. For example, when the leading wire 702 and the leading wire 703 are compared, the leading wire 702 has a longer length than the leading wire 703. Thus, at the time of forming the leading wire 703, resistance value of each of the wires can be made equal by forming a region 704 in which a low resistance material is not used in a part of the wire 703. The length of the region in which the low resistance material is not used may be adjusted as appropriate, since it depends on the material of the leading wire, the cross sectional area of the leading wire, the difference between the lengths of the leading wires, and the like. Note that "the resistance value is almost equal" means that a resistance value of one of the objects being compared is greater than or equal to 80% and less than or equal to 120%, preferably, greater than or equal to 90% and less than or equal to 110% of that of the other object being compared.

The leading wires are formed at the same time as a gate wire, a source wire (or drain wire) or the like in a manufacturing process of a panel. The panel used in this embodiment mode is not limited to a liquid crystal panel or an EL panel. The manufacturing method of the panel is not limited to Embodiment Modes 6 to 8, and another method may be adopted. In a connection portion between an FPC and a wire over the substrate, a low resistance material may or may not be formed in the wire. FIG. 12C shows an FPC 707 electrically connected to a wire 708 formed over a substrate through a connection portion 709 in a case where a low resistance material is not formed in the connection portion. The wire is formed from conductive films 708*a* and 708*c* which serve as a barrier film and a conductive film 708*b* made of a low resistance material.

Although this embodiment mode shows the case where the driver circuit is connected to the substrate by using the FPC (Flexible Printed Circuit), the present invention is not limited to this embodiment mode, and the driver circuit may be connected to the substrate by using COG (Chip On Glass) or a printed board, or the driver circuit itself may be formed over the substrate such that the driver circuit and the substrate are integrated. In these cases also, a display device with reduced signal delay can be manufactured in accordance with the present invention.

FIG. 12B is an enlarged view of the circular region surrounded by a broken line in FIG. 12A. Reference numeral 705 denotes a conductive film made of a low resistance material and reference numeral 706 denotes a conductive film serving as a barrier film. In accordance with the present invention, leading wires which have a portion that is formed without using a low resistance material can be formed, and thus, signal delay can be reduced.

The structure of the leading wires is not limited to this embodiment mode. In a case where the objective is only to solve the problem of signal delay caused by the leading wires, a structure may be employed, for example, in which the greater part of a leading wire is formed from a conductive film serving as a barrier film, and only a part of the leading wire is formed from a low resistance material to reduce the resistance value of that part, thereby adjusting the resistance value of the wire.

By adopting the above described structure, a display device with reduced wire resistance which can operate at high speed can be manufactured. At the same time, the problem of signal delay caused by a leading wire can be solved. Moreover, since the area occupied by the leading wires can be reduced, a display device which effectively utilizes a substrate area can be manufactured.

This embodiment mode can be freely combined with any of Embodiment Modes 1 to 8.

Embodiment Mode 10

In Embodiment Mode 10, a large-sized display device using the present invention will be described with reference FIG. 14.

Figure 14:
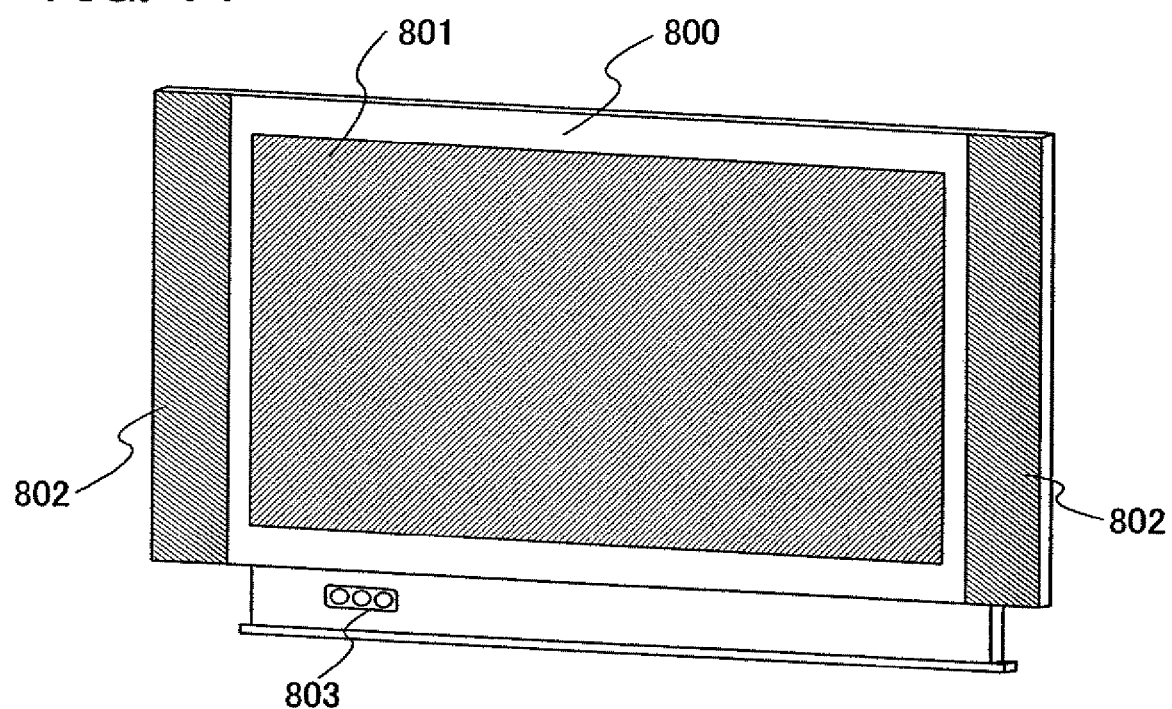
FIG. 14 shows a large-sized display device using the present invention.

FIG. 14 shows a large-sized display device having a large screen of greater than or equal to 30 inches and less than 100 inches, for example, which includes a casing 800, a display portion 801, a speaker 802, operation switches 803, and the like. Note that the 'large-sized display device' encompasses all display devices for displaying information, such as a display device for a computer, a display device for receiving TV broadcasting, a display device for bidirectional TV, and the like. In accordance with the present invention, a display device with reduced signal delay caused by leading wires can be manufactured. By using a low resistance material as a wire, a large-sized display device which has low power consumption and can operate at high speed can be manufactured. Note that the present invention is also effective in that the area occupied by a leading wire is reduced and thus, a substrate area can be used effectively.

This embodiment mode can be freely combined with any of Embodiment Modes 1 to 9. The present invention is not limited to a display device having a screen of greater than or equal to 30 inches and less than 100 inches. In a large-sized display device having a screen of 100 inches or more, the present invention can be utilized very effectively.

Embodiment Mode 11

Electronic devices using a display device of the present invention will be described with reference to FIGS. 15A to 15E. In particular, the present invention is remarkably effective for large-sized display devices; however, the present invention is not limited to large-sized display devices, and can be applied to, for example, middle or small size display devices (for example, ones having a screen of less than 30 inches), thanks to advantageous effects which result from reduced wire resistance, such as lower power consumption, high speed operation of the display device, and effective use of the area of a substrate due to reduction of the area required for leading wires. Examples which can be given of electronic devices of the present invention include a camera such as a video camera and a digital camera, a goggle type display (head mounted display), navigation systems, audio reproducing devices (car audio components, MP3 players and the like), computers, game machines, portable information terminals (e.g., mobile computers, mobile phones, portable game machines, electronic dictionaries, electronic books, and the like), image reproducing devices equipped with a recording medium (specifically, devices having a display that can reproduce content of a recording medium such as a digital versatile disc (DVD) and can display an image thereof). Specific examples of these electronic devices are shown in FIGS. 15A to 15E.

Figure 15A:
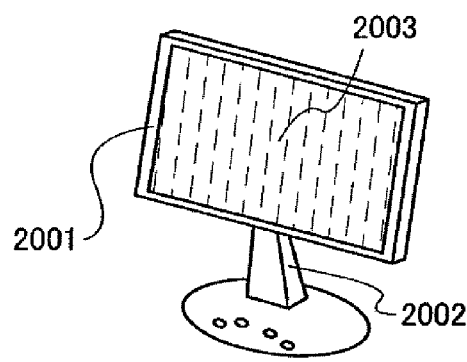
FIGS. 15A to 15E show electronic devices using a display device according to an aspect of the present invention.

FIG. 15A shows a display device, which corresponds to a monitor for a computer, or a television receiver, or the like. The display device includes a casing 2001, a support 2002, a display portion 2003, and the like. In accordance with the present invention, a display device in which the effect of signal delay is reduced can be manufactured. Further, a display device in which an area occupied by leading wires is reduced and a substrate area is utilized effectively, and which has low power consumption and can operate at high speed can be manufactured.

Figure 15B:
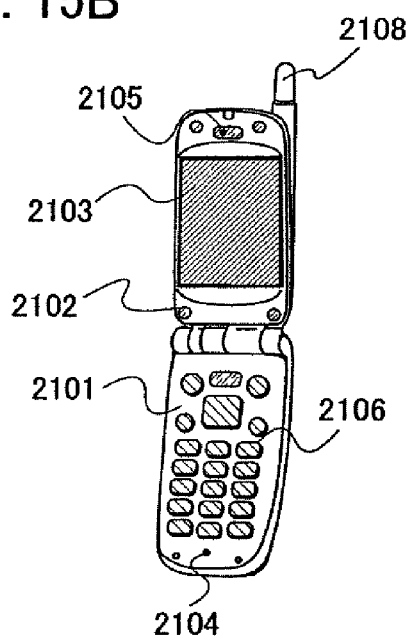

FIG. 15B shows a mobile phone by which people can watch TV, including a main body 2101, a casing 2102, a display portion 2103, an audio input portion 2104, an audio output portion 2105, operation keys 2106, an antenna 2108, and the like. In accordance with the present invention, a display device in which the effect of signal delay is reduced can be manufactured. Further, a mobile phone in which the area occupied by leading wires is reduced and a substrate area is utilized effectively, and which has low power consumption and can operate at high speed can be manufactured.

Figure 15C:
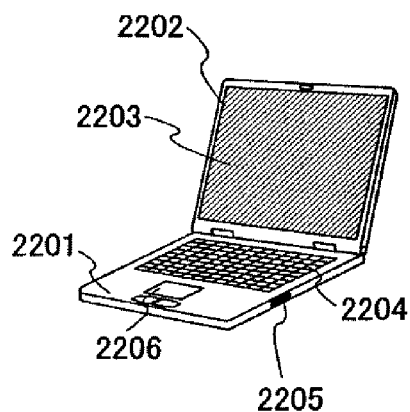

FIG. 15C shows a computer, including a main body 2201, a casing 2202, a display portion 2203, a keyboard 2204, an external connection port 2205, a pointing mouse 2206, and the like. In accordance with the present invention, a computer having a display device in which the effect of signal delay is reduced can be manufactured. Further, a computer which has a display portion in which the area occupied by leading wires is reduced and a substrate area is utilized effectively, and which has low power consumption and can operate at high speed can be manufactured. Although FIG. 15C shows a laptop type computer as an example, the present invention can be applied to a desk top type computer unified with a monitor, and the like.

Figure 15D:
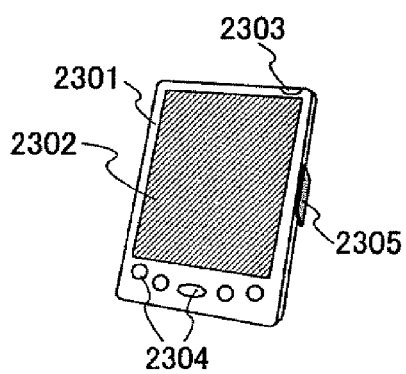

FIG. 15D shows a mobile computer, including a main body 2301, a display portion 2302, a switch 2303, operation keys 2304, an infrared port 2305, and the like. In accordance with the present invention, a mobile computer which has a display portion in which the effect of signal delay is reduced and which has low power consumption and can operate at high speed can be manufactured. Moreover, a mobile computer having a display portion in which the area occupied by leading wires is reduced and a substrate area is utilized effectively can be manufactured.

Figure 15E:
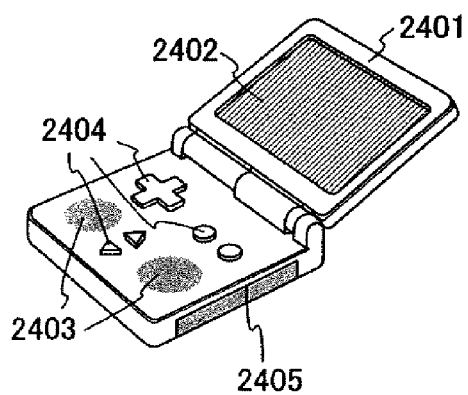

FIG. 15E shows a portable game machine, including a casing 2401, a display portion 2402, speaker portions 2403, operation keys 2404, a recording medium insertion portion 2405, and the like. In accordance with the present invention, a game machine which has a display device in which the effect of signal delay is reduced can be manufactured. Further, a game machine which has a display portion in which an area occupied by leading wires is reduced and a substrate area is utilized effectively, and which has low power consumption and can operate at high speed can be manufactured.

As described above, the range of application of the present invention is extremely wide and the present invention can be used for electronic devices in all kinds of fields.

This embodiment mode can be freely combined with any of Embodiment Modes 1 to 9.

The present application is based on Japanese Patent application No. 2005-333207 filed on Nov. 17, 2005 with the Japanese Patent Office, the entire contents of which are hereby incorporated by reference.

What is claimed is:
1. A display device comprising:
   a semiconductor film;
   a gate wire;
   a gate insulating film interposed between the semiconductor film and the gate wire; and
   a source or drain wire electrically connected to the semiconductor film,
   wherein the gate wire comprises:
      a first conductive film;
      a second conductive film over the first conductive film so that a width of the second conductive film is smaller than a width of the first conductive film; and
      a third conductive film over the first conductive film so as to cover a top surface and a side surface of the second conductive film, and
   wherein the source or drain wire comprises:
      a fourth conductive film;
      a fifth conductive film over the fourth conductive film so that a width of the fifth conductive film is smaller than a width of the fourth conductive film; and
      a sixth conductive film over the fourth conductive film so as to cover a top surface and a side surface of the fifth conductive film.

2. The display device according to claim 1, wherein the second conductive film includes copper.

3. The display device according to claim 1, wherein the first conductive film or the third conductive film includes at least one of tungsten, molybdenum, chromium and titanium.

4. The display device according to claim 1, wherein the first conductive film and the third conductive film are formed from the same material.

5. The display device according to claim 1, wherein the fifth conductive film includes copper.

6. The display device according to claim 1, wherein the fourth conductive film or the sixth conductive film includes at least one of tungsten, molybdenum, chromium and titanium.

7. The display device according to claim 1, wherein the fourth conductive film and the sixth conductive film are formed from the same material.

8. The display device according to claim 1, further comprising a capacitor wire which is formed in the same layer as the gate wire.

9. The display device according to claim 1, further comprising a power supply line which is formed in the same layer as the source or drain wire.

10. A display device comprising:
    a gate wire;

a gate insulating film formed over the gate wire;
a first semiconductor film formed over the gate insulating film;
a second semiconductor film doped with an impurity element which is formed over the first semiconductor film; and
a source or drain wire which is electrically connected to the second semiconductor film,
wherein the gate wire comprises:
  a first conductive film;
  a second conductive film over the first conductive film so that a width of the second conductive film is smaller than a width of the first conductive film; and
  a third conductive film over the first conductive film so as to cover a top surface and a side surface of the second conductive film, and
wherein the source or drain wire comprises:
  a fourth conductive film;
  a fifth conductive film over the fourth conductive film so that a width of the fifth conductive film is smaller than a width of the fourth conductive film; and
  a sixth conductive film over the fourth conductive film so as to cover a top surface and a side surface of the fifth conductive film.

11. The display device according to claim 10, wherein the second conductive film includes copper.

12. The display device according to claim 10, wherein the first conductive film or the third conductive film includes at least one of tungsten, molybdenum, chromium and titanium.

13. The display device according to claim 10, wherein the first conductive film and the third conductive film are formed from the same material.

14. The display device according to claim 10, wherein the fifth conductive film includes copper.

15. The display device according to claim 10, wherein the fourth conductive film or the sixth conductive film includes at least one of tungsten, molybdenum, chromium and titanium.

16. The display device according to claim 10, wherein the fourth conductive film and the sixth conductive film are formed from the same material.

17. The display device according to claim 10, further comprising a capacitor wire which is formed in the same layer as the gate wire.

18. The display device according to claim 10, further comprising a power supply line which is formed in the same layer as the source or drain wire.

19. A display device comprising:
a semiconductor film;
a gate wire;
a gate insulating film interposed between the semiconductor film and the gate wire; and
a source or drain wire electrically connected to the semiconductor film,
wherein the source or drain wire comprises:
  a first conductive film;
  a second conductive film over the first conductive film so that a width of the second conductive film is smaller than a width of the first conductive film; and
  a third conductive film over the first conductive film so as to cover a top surface and a side surface of the second conductive film.

20. The display device according to claim 19, wherein the second conductive film includes copper.

21. The display device according to claim 19, wherein the first conductive film or the third conductive film includes at least one of tungsten, molybdenum, chromium and titanium.

22. The display device according to claim 19, wherein the first conductive film and the third conductive film are formed from the same material.

23. The display device according to claim 19, further comprising a capacitor wire which is formed in the same layer as the gate wire.

24. The display device according to claim 19, further comprising a power supply line which is formed in the same layer as the source or drain wire.

* * * * *